US011342945B2

(12) United States Patent
Chen et al.

(10) Patent No.: US 11,342,945 B2
(45) Date of Patent: May 24, 2022

(54) METHOD AND APPARATUS FOR PROCESSING RATE MATCHING OF POLAR CODES

(71) Applicant: ZTE Corporation, Guangdong (CN)

(72) Inventors: Mengzhu Chen, Guangdong (CN); Jin Xu, Guangdong (CN); Jun Xu, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/505,688

(22) Filed: Jul. 8, 2019

(65) Prior Publication Data

US 2020/0083912 A1 Mar. 12, 2020

Related U.S. Application Data

(63) Continuation of application No. PCT/CN2018/071956, filed on Jan. 9, 2018.

(30) Foreign Application Priority Data

Jan. 9, 2017 (CN) .......................... 201710014289.6
Jan. 25, 2017 (CN) .......................... 201710056532.0

(51) Int. Cl.
*H03M 13/00* (2006.01)
*H03M 13/13* (2006.01)
*H03M 13/27* (2006.01)

(52) U.S. Cl.
CPC ......... *H03M 13/635* (2013.01); *H03M 13/13* (2013.01); *H03M 13/2792* (2013.01)

(58) Field of Classification Search
CPC ............... H03M 13/635; H03M 13/13; H03M 13/2792; H03M 13/6502; H03M 13/6591;
(Continued)

(56) References Cited

U.S. PATENT DOCUMENTS 8,726,121 B2    5/2014  Malladi et al.
2015/0156242 A1 6/2015  Hwang et al.
(Continued)

FOREIGN PATENT DOCUMENTS

CN    103023618 A    4/2013
CN    103746708 A    4/2014
(Continued)

OTHER PUBLICATIONS

3GPP, Ericsson, "Considerations of CBRM and HARQ Operations," TSG-RAN WG1#49bis, R1-073030, Orlando, USA, Jun. 2007 (4 pages).

(Continued)

*Primary Examiner* — James C Kerveros
(74) *Attorney, Agent, or Firm* — Perkins Coie LLP

(57) ABSTRACT

Provided is a rate matching method and device for a Polar code. The method includes: concatenating K information bits and (N−K) frozen bits to generate a bit sequence of N bits, and encoding the bit sequence of N bits by means of a Polar code encoder with a generator matrix of size N×N to generate an initial bit sequence $\{S_0, S_1, \ldots, S_{N-1}\}$ of bits, where K and N are both positive integers and K is less than or equal to N; dividing a circular buffer into q parts, selecting bits from the initial bit sequence $\{S_0, S_1, \ldots, S_{N-1}\}$ in a non-repeated manner, and writing the bits into the q parts of the circular buffer according to a predefined rule, where q=1, 2, 3 or 4; and sequentially selecting a bit sequence of a specified length from a predefined starting position in a bit sequence in the circular buffer and taking the bit sequence of the specified length as a bit sequence to be transmitted.

9 Claims, 3 Drawing Sheets

(58) Field of Classification Search
CPC ... H04L 1/0071; H04L 1/0057; H04L 1/0067; H04L 1/0041
USPC .......................................................... 714/776
See application file for complete search history.

(56) References Cited

U.S. PATENT DOCUMENTS

| | | | | |
|---|---|---|---|---|
| 2016/0352464 | A1* | 12/2016 | Shen | ..................... H03M 13/13 |
| 2017/0005753 | A1* | 1/2017 | Shen | ..................... H04L 1/1819 |
| 2018/0026663 | A1* | 1/2018 | Wu | ..................... H03M 13/6362 714/776 |
| 2019/0305887 | A1* | 10/2019 | Jang | ..................... H03M 13/09 |
| 2020/0083912 | A1* | 3/2020 | Chen | ..................... H03M 13/13 |

FOREIGN PATENT DOCUMENTS

| | | |
|---|---|---|
| CN | 105811998 A | 7/2016 |
| EP | 3 079 290 A1 | 10/2016 |
| EP | 3 113 387 A1 | 1/2017 |
| KR | 10-2016-0096684 A | 8/2016 |
| KR | 2016-0130471 A | 11/2016 |

OTHER PUBLICATIONS

3GPP, ZTE, "Polar Codes Contruction and Rate Matching Scheme," TSG RAN WG1 Meeting #89, R1-1707183, Hangzhou, China, May 2017 (13 pages).
Extended Search Report dated Aug. 6, 2020 for European Application No. 18736435.1, filed on Jan. 9, 2018 (11 pages).
International Search Report and Written Opinion dated Mar. 28.2018 for International Application No. PCT/CN2018/071956, filed on Jan. 9, 2018 (11 pages).
Japanese Office Action dated Nov. 4, 2020 for Japanese Patent Application No. 2019-537290, filed on Jan. 9, 2018 (x pages).
Korean Office Action dated May 20, 2020 for Korean Patent Application No. 10-2019-7023378, filed on Jan. 9, 2018 (8 pages).
Decision of Patent dated Apr. 6, 2021 for Japanese Patent Application No. 2019-537290, filed on Jan. 9, 2018 (4 pages).
Indian Office Action dated Apr. 23, 2021 for Indian Patent Application No. 201937032233, filed on Jan. 9, 2018 (6 pages).
Notice of Allowance dated Jan. 18, 2021 for Korean Patent Application No. 10-2019-7023378, filed on Jan. 9, 2018 (6 pages).

* cited by examiner

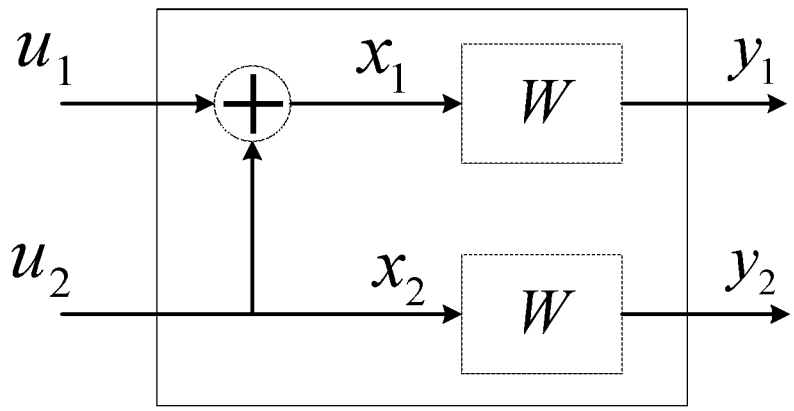

FIG. 2

Concatenate K information bits and (N-K) frozen bits to generate a bit sequence of N bits, and encode the bit sequence of N bits by means of a polar code encoder with a generator matrix of size N×N to generate an initial bit sequence $\{S_0, S_1,...,S_{N-1}\}$ of N bits, where K and N are both positive integers and K is less than or equal to N ⎯302

Divide a circular buffer into q parts, select bits from the initial bit sequence $\{S_0, S_1,...,S_{N-1}\}$ in a non-repeated manner and write the bits into the q parts of the circular buffer according to a preset processing rule, where q=1, 2, 3 or 4 ⎯304

Sequentially read a bit sequence of a specified length from a preset starting position in an bit sequence obtained in the circular buffer and take the bit sequence of the specified length as a rate matching bit sequence to be transmitted ⎯306

FIG. 3

METHOD AND APPARATUS FOR PROCESSING RATE MATCHING OF POLAR CODES

CROSS REFERENCE TO RELATED APPLICATIONS

This patent document is a continuation of and claims priority to International Patent Application No. PCT/CN2018/071956, filed on Jan. 9, 2018, which claims the benefit of priority of Chinese Patent Application No. 201710014289.6, filed on Jan. 9, 2017, and Chinese Patent Application No. 201710056532.0, filed on Jan. 25, 2017. The entire contents of the before-mentioned patent applications are incorporated by reference as part of the disclosure of this application.

TECHNICAL FIELD

The present disclosure relates to the field of communications and, for example, to a rate matching method and device for a Polar code.

BACKGROUND

In the related art, Polar code is a rigorously proven constructive code capable of reaching a channel capacity and satisfying requirements of the fifth generation radio access technology (5G RAT) for the throughput and latency in the communication. A codeword obtained from the Polar encoding may be expressed as $x=u \cdot G_N$, where $u=(u_1, \ldots, u_N)$ consists of information bits and frozen bits. The information bits may include one or more check bits. The check bits may be generated through parity check encoding, cyclic redundancy check encoding, RS encoding and the like. The frozen bits are known bits in the encoding, and generally are 0 or pseudo-random bits.

The structure of the Polar encoder of length N may be obtained by a recursion of two encoder of length N/2. FIG. 1a and FIG. 1b are schematic diagrams of a recursive structure of a Polar code in the related art. FIG. 2 is a structural diagram of a basic unit of a recursive encoder structure of a Polar code in the related art. As shown in FIG. 1a, FIG. 1b and FIG. 2, a unit (N=2) of a recursive structure is the basic unit shown in FIG. 2.

The length N of a data bit sequence obtained from the Polar encoding is a power of 2 and unnecessary bits can be discarded in a puncturing or shortening manner to perform rate matching for the transmission of any code length. Different code lengths and code rates correspond to different rate matching patterns. Therefore, different hardware modules are needed to implement the rate matching, thereby resulting in high complexity of Polar code hardware in different application scenarios.

No effective solution has been proposed for the problem in the related art of high complexity of Polar code hardware for transmitting a bit sequence of any length.

SUMMARY

The present disclosure provides a rate matching method and device for a Polar code to solve at least the problem in the related art of high complexity of Polar code hardware for transmitting a bit sequence of any length.

The present disclosure provides a rate matching method for a Polar code, including: K information bits and (N−K) frozen bits are concatenated to generate a bit sequence of N bits, and the bit sequence of N bits is encoded by means of a Polar code encoder with a generator matrix of size N×N to generate an initial bit sequence $\{S_0, S_1, \ldots S_{N-1}\}$ of N bits, wherein K and N are both positive integers and K is less than or equal to N.

A circular buffer is divided into q parts, bits are selected from the initial bit sequence $\{S_0, S_1, \ldots, S_{N-1}\}$ in a non-repeated manner, and the bits are written into the q parts of the circular buffer according to a predefined rule, where q=1, 2, 3 or 4.

A bit sequence of a specified length is sequentially selected from a predefined starting position in a bit sequence in the circular buffer, and the bit sequence of the specified length is taken as a bit sequence to be transmitted.

In some embodiments, the K information bits may include check bits.

In some embodiments, the predefined rule is determined by a one-to-one mapping interleaving function f(n) generated according to a data characteristic of the Polar code, where n=0, 1, ..., N−1, f(n)=0, 1, ..., N−1, n is a bit position index in the initial bit sequence, and f(n) is a position index in the circular buffer; and selecting the bits from the initial bit sequence $\{S_0, S_1, \ldots, S_{N-1}\}$ in the non-repeated manner and writing the bits into the q parts of the circular buffer according to the predefined rule includes: mapping a bit $S_n$ with a bit position index n in the initial bit sequence onto a position with a position index f(n) in the circular buffer according to the one-to-one mapping interleaving function f(n).

It is to be noted that since a mapping $\{n\} \rightarrow \{f(n)\}$ is a one-to-one mapping, an inverse function p(n) of f(n), which satisfies a mapping $\{p(n)\} \rightarrow \{n\}$, exists. That is, the predefined rule may be determined by a one-to-one mapping interleaving function p(n) generated according to the data characteristic of the Polar code, where n=0, 1, ..., N−1, p(n)=0, 1, ..., N−1, p(n) is a bit position index in the initial bit sequence, and n is a position index in the circular buffer. Selecting the bits from the initial bit sequence $\{S_0, S_1, \ldots, S_{N-1}\}$ in the non-repeated manner and writing the bits into the q parts of the circular buffer according to the predefined rule includes: mapping a bit $S_{p(n)}$ with a bit position index p(n) in the initial bit sequence onto a position with a position index n in the circular buffer according to the one-to-one mapping interleaving function p(n).

In some embodiments, the one-to-one mapping interleaving function f(n) has the following nesting characteristic: a mapping $\{n_0\} \rightarrow \{f(n_0)\}$ may be obtained by deleting an element greater than $N_0$ from a sequence $\{n\}$ and a sequence $\{f(n)\}$ in a mapping $\{n\} \rightarrow \{f(n)\}$ of the one-to-one mapping interleaving function, where $n_0=0, 1, 2, \ldots, N_0-1$ and $N_0$ is a positive integer less than or equal to N.

In some embodiments, selecting the bits from the initial bit sequence $\{S_0, S_1, \ldots, S_{N-1}\}$ in the non-repeated manner and writing the bits into the q parts of the circular buffer according to the predefined rule includes: mapping a bit $S_n$ with a bit position index n in the initial bit sequence onto a position with a position index mod(f(n)+m, N) in the circular buffer, wherein m=0, 1, ..., N−1, m is an offset and mod(x1,x2) represents a remainder of a division x1/x2, where x1 is an integer and x2 is a positive integer.

In some embodiments, the data characteristic includes at least one of: a transport block length, a code rate, a number of available physical resource blocks, a modulation and coding level, a user equipment type index and a data transmission link direction.

In some embodiments, the predefined starting position includes one of the following:

A starting bit position of the bit sequence in the circular buffer is taken as the predefined starting position.

A position of $P_0=M-1$ in the circular buffer is taken as the predefined starting position, where $P_0$ represents a position index of the bit sequence in the circular buffer and M is a length of the bit sequence to be transmitted.

A position of $P_0=N-M$ in the circular buffer is taken as the predefined starting position, where $P_0$ represents the position index of the bit sequence in the circular buffer, M is the length of the sequence to be transmitted, and N is a length of the initial bit sequence.

An ending bit position of the bit sequence in the circular buffer is taken as the predefined starting position.

In some embodiments, the predefined starting position is determined by a code rate of the Polar encoding.

In some embodiments, the predefined starting position may be selected in the following manner:

When the code rate of the Polar encoding is less than or equal to a predefined threshold, the position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

It is to be noted that since the predefined starting position is selected according to the code rate of the Polar encoding, when the code rate of the Polar encoding is greater than the predefined threshold, the predefined starting position is determined by one of the following manners:

The starting bit position of the bit sequence in the circular buffer is taken as the predefined starting position.

The position of $P_0=M-1$ in the circular buffer is taken as the predefined starting position, where $P_0$ represents the position index of the bit sequence in the circular buffer and M is the length of the bit sequence to be transmitted.

The ending bit position of the bit sequence in the circular buffer is taken as the predefined starting position.

When the circular buffer is composed of a sixth part, a seventh part, an eighth part and a ninth part arranged sequentially, a starting bit position of the seventh part of the bit sequence in the circular buffer is taken as the predefined starting position.

When the circular buffer is composed of the sixth part, the seventh part, the eighth part and the ninth part arranged sequentially, an ending bit position of the eighth part of the bit sequence in the circular buffer is taken as the predefined starting position.

When the circular buffer is composed of the sixth part, the seventh part, the eighth part and the ninth part arranged sequentially, a starting bit position of the eighth part of the bit sequence in the circular buffer is taken as the predefined starting position.

When the circular buffer is composed of the sixth part, the seventh part, the eighth part and the ninth part arranged sequentially, a starting bit position of the ninth part of the bit sequence in the circular buffer is taken as the predefined starting position.

When the circular buffer is composed of the sixth part, the seventh part, the eighth part and the ninth part arranged sequentially, if $M \leq t_8+t_9$, a position of $P_0=t_6+t_7+M-1$ is taken as the predefined starting position; if $M>t_8+t_9$, a position of $P_0=M-1-t_8-t_9$ is taken as the predefined starting position, where M is the length of the bit sequence to be transmitted, $t_6$ is a length in bits of the sixth part, $t_7$ is a length in bits of the seventh part, $t_8$ is a length in bits of the eighth part, and $t_9$ is a length in bits of the ninth part.

When the circular buffer is composed of the sixth part, the seventh part, the eighth part and the ninth part arranged sequentially, an ending bit position of the sixth part of the bit sequence in the circular buffer is taken as the predefined starting position.

When the circular buffer is composed of the sixth part, the seventh part, the eighth part and the ninth part arranged sequentially, if $M \leq t_8+t_9$, a position of $P_0=t_8+t_9-M$ is taken as the predefined starting position; if $M>t_8+t_9$, a position of $P_0=N+t_8+t_9-M$ is taken as the predefined starting position, where M is the length of the bit sequence to be transmitted, $t_6$ is the length in bits of the sixth part, $t_7$ is the length in bits of the seventh part, $it_8$ is the length in bits of the eighth part, and $t_9$ is the length in bits of the ninth part.

When the circular buffer is composed of the sixth part, the seventh part, the eighth part and the ninth part arranged sequentially, the starting bit position of the ninth part of the bit sequence in the circular buffer is taken as the predefined starting position.

When the circular buffer is composed of the sixth part, the seventh part, the eighth part and the ninth part arranged sequentially, an ending bit position of the seventh part of the bit sequence in the circular buffer is taken as the predefined starting position.

When the circular buffer is composed of the sixth part, the seventh part, the eighth part and the ninth part arranged sequentially, the ending bit position of the sixth part of the bit sequence in the circular buffer is taken as the predefined starting position.

In some embodiments, the predefined starting position may be determined by the following manner:

When the code rate of the Polar encoding is greater than the predefined threshold, the starting bit position of the bit sequence in the circular buffer is taken as the predefined starting position.

In some embodiments, a mother code of the Polar code has a length of $N=2^{\lceil log_2(K/R) \rceil+m}$, wherein $\lceil \ \rceil$ represents a ceiling operation, R is a code rate and m is a positive integer.

In some embodiments, the bit sequence in the circular buffer is obtained by performing bit reversal order (BRO) interleaving on the initial bit sequence $\{S_0, S_1, \ldots, S_{N-1}\}$, and a bit $S_n$ with a bit position index n in the initial bit sequence is mapped onto a position with a position index mod(BRO(n)+m, N) in the circular buffer by means of a BRO interleaver, where n=0, 1, ..., N-1, m=0, 1, ..., N-1, m is an offset and mod(x1,x2) represents a remainder of a division x1/x2.

In some embodiments, the bit sequence in the circular buffer is obtained by performing bit reversal order (BRO) interleaving on the initial bit sequence $\{S_0, S_1, \ldots, S_{N-1}\}$, and a bit Sn with a bit position index n in the initial bit sequence is mapped onto a position with a position index N-1-mod(BRO(n)+m, N) in the circular buffer by means of a BRO interleaver, where n=0, 1, ..., N-1, m=0, 1, ..., N-1, m is an offset and mod(x1,x2) represents a remainder of a division x1/x2.

In some embodiments, sequentially selecting the bit sequence of the specified length from the predefined starting position in the bit sequence in the circular buffer and taking the bit sequence of the specified length as the bit sequence to be transmitted includes:

Bits are sequentially selected in an ascending or descending order of indexes from a predefined position in the bit sequence in the circular buffer, when reaching to an end of the bit sequence in the circular buffer, the selecting is continued from an other end of the bit sequence in the circular buffer until the bit sequence of the specified length is selected, and the bit sequence of the specified length is taken as the bit sequence to be transmitted.

In some embodiments, when a code rate of the Polar encoding is less than or equal to a predefined threshold, a position of $P_0=N-M$ in the circular buffer is taken as the predefined starting position and M bits are sequentially selected in an ascending order of indexes; when the selecting goes to an end of the bit sequence in the circular buffer, the selecting is continued from an other end of the bit sequence in the circular buffer, where $P_0$ represents a position index of the bit sequence in the circular buffer, M is a length of the bit sequence to be transmitted, and N is a length of the initial bit sequence.

In some embodiments, when a code rate of the Polar encoding is greater than a predefined threshold, a starting bit position of the bit sequence in the circular buffer is taken as the predefined starting position and M bits are sequentially selected in an ascending order of indexes; when the reading goes to an end of the bit sequence in the circular buffer, the reading is continued from an other end of the bit sequence in the circular buffer, wherein N is a length of the initial bit sequence.

In some embodiments, the bit sequence to be transmitted is arranged in a same order or in a reverse order of the bit sequence of the specified length read from the circular buffer.

The present disclosure further provides a rate matching device for a Polar code, including a generation module, a writing module, a selecting module and a determination module. The generation module is configured to concatenate K information bits and (N–K) frozen bits to generate a bit sequence of N bits, and encode the bit sequence of N bits by means of a Polar code encoder with a generator matrix of size N×N to generate an initial bit sequence $\{S_0, S_1, \ldots, S_{N-1}\}$ of N bits, where K and N are both positive integers and K is less than or equal to N. The writing module is configured to divide a circular buffer into q parts, select bits from the initial bit sequence $\{S_0, S_1, \ldots, S_{N-1}\}$ in a non-repeated manner, and write the bits into the q parts of the circular buffer according to a predefined rule, wherein q=1, 2, 3 or 4. The selecting module is configured to sequentially select a bit sequence of a specified length from a predefined starting position in a bit sequence in the circular buffer. The determination module is configured to take the bit sequence of the specified length as a bit sequence to be transmitted.

In some embodiments, the predefined rule is determined by a one-to-one mapping interleaving function f(n) generated according to a data characteristic of the Polar code, wherein n=0, 1, . . . , N–1, f(n)=0, 1, . . . , N–1, n is a bit position index in the initial bit sequence, and f(n) is a position index in the circular buffer. The writing module is configured to map a bit Sn with a bit position index n in the initial bit sequence onto a position with a position index f(n) in the circular buffer according to the one-to-one mapping interleaving function f(n).

It is to be noted that since a mapping $\{n\}\rightarrow\{f(n)\}$ is a one-to-one mapping, an inverse function p(n) of f(n), which satisfies a mapping $\{p(n)\}\rightarrow\{n\}$, exists. That is, the predefined rule may be determined by a one-to-one mapping interleaving function p(n) generated according to the data characteristic of the Polar code, where n=0, 1, . . . , N–1, p(n)=0, 1, . . . , N–1, p(n) is a bit position index in the initial bit sequence, and n is a position index in the circular buffer. Selecting the bits from the initial bit sequence $\{S_0, S_1, \ldots, S_{N-1}\}$ in the non-repeated manner and writing the bits into the q parts of the circular buffer according to the predefined rule includes: mapping a bit Sp(n) with a bit position index p(n) in the initial bit sequence onto a position with a position index n in the circular buffer according to the one-to-one mapping interleaving function p(n).

In some embodiments, the one-to-one mapping interleaving function f(n) has the following nesting characteristic:

a mapping $\{n_0\}\rightarrow\{f(n_0)\}$ may be obtained by deleting an element greater than $N_0$ from a sequence $\{n\}$ and a sequence $\{f(n)\}$ in a mapping $\{n\}\rightarrow\{f(n)\}$ of the one-to-one mapping interleaving function, where $n_0=0, 1, 2, \ldots, N_0-1$ and $N_0$ is a positive integer less than or equal to N.

In some embodiments, the predefined rule for the initial bit sequence $\{S_0, S_1, \ldots, S_{N-1}\}$ may be performed by mapping the bit $S_n$ with the bit position index n in the initial bit sequence onto a position with a position index mod(f(n)+m, N) in the circular buffer according to the data characteristic of the Polar code, where m=0, 1, . . . , N–1, m is an offset and $mod(x_1,x_2)$ represents a remainder of a division $x_1/x_2$, where $x_1$ is an integer and $x_2$ is a positive integer.

In some embodiments, the predefined starting position is selected in one of the following manners:

A starting bit position of the bit sequence in the circular buffer is taken as the predefined starting position.

A position of $P_0=M-1$ in the circular buffer is taken as the predefined starting position, where $P_0$ represents a position index of the bit sequence in the circular buffer and M is a length of the bit sequence to be transmitted.

A position of $P_0=N-M$ in the circular buffer is taken as the predefined starting position, where $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

The present disclosure further provides a rate matching device for a Polar code, including: a processor and a memory. The processor is configured to perform the following operations: K information bits and (N–K) frozen bits are concatenated to generate a bit sequence of N bits, and the bit sequence of N bits is encoded by means of a Polar code encoder with a generator matrix of size N×N to generate an initial bit sequence $\{S_0, S_1, \ldots, S_{N-1}\}$ of N bits, where K and N are both positive integers and K is less than or equal to N; a circular buffer is divided into q parts, bits are selected from the initial bit sequence $\{S_0, S_1, \ldots, S_{N-1}\}$ in a non-repeated manner, and the bits are written into the q parts of the circular buffer according to a predefined rule, where q=1, 2, 3 or 4; and a bit sequence of a specified length is sequentially selected from a predefined starting position in an bit sequence in the circular buffer and the bit sequence of the specified length is taken as a bit sequence to be transmitted.

In some embodiments, the processor is further configured to perform, according to the instructions sored in the memory, the following operations: the predefined rule for the initial bit sequence $\{S_0, S_1, \ldots, S_{N-1}\}$ is determined by a one-to-one mapping interleaving function f(n) generated according to a data characteristic of the Polar code, where n=0, 1, . . . , N–1, f(n)=0, 1, . . . , N–1, n is a bit position index in the initial bit sequence, and f(n) is a position index in the circular buffer; and a bit Sn with a bit position index n in the initial bit sequence is mapped onto a position with a position index f(n) in the circular buffer according to the one-to-one mapping interleaving function f(n).

Since a mapping $\{n\}\rightarrow\{f(n)\}$ is a one-to-one mapping, an inverse function p(n) of f(n), which satisfies a mapping {p(n)}→{n}, exists. That is, the predefined rule may be determined by a one-to-one mapping interleaving function p(n) generated according to the data characteristic of the Polar code, where n=0, 1, . . . , N−1, p(n)=0, 1, . . . , N−1, p(n) is a bit position index in the initial bit sequence, and n is a position index in the circular buffer. The operation of selecting the bits from the initial bit sequence {$S_0$, $S_1$, . . . , $S_{N-1}$} in the non-repeated manner and writing the bits into the q parts of the circular buffer according to the predefined rule includes: mapping a bit $S_{p(n)}$ with a bit position index p(n) in the initial bit sequence onto a position with a position index n in the circular buffer according to the one-to-one mapping interleaving function p(n).

In some embodiments, the predefined starting position is selected in one of the following manners:

A starting bit position of the bit sequence in the circular buffer is taken as the predefined starting position.

A position of $P_0$=M−1 in the circular buffer is taken as the predefined starting position, wherein $P_0$ represents a position index of the bit sequence in the circular buffer and M is a length of the bit sequence to be transmitted.

A position of $P_0$=N−M in the circular buffer is taken as the predefined starting position, wherein $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

The present disclosure further provides a computer storage medium, which is configured to store executive instructions for executing any rate matching method for the Polar code in the embodiments described above.

The rate matching method and device for the Polar code provided by the present disclosure can solve the problem that Polar code hardware has high complexity and has a complicated encoding process in a hybrid automatic repeat request mechanism, significantly reducing the complexity of Polar code hardware and simplifying the encoding process in the hybrid automatic repeat request mechanism.

BRIEF DESCRIPTION OF DRAWINGS

FIG. 2 is a structural diagram of a basic unit of a recursive encoding structure of a Polar code in the related art;

FIG. 3 is a flowchart of a rate matching method for a Polar rate according to an embodiment;

DETAILED DESCRIPTION

Figure 1A:
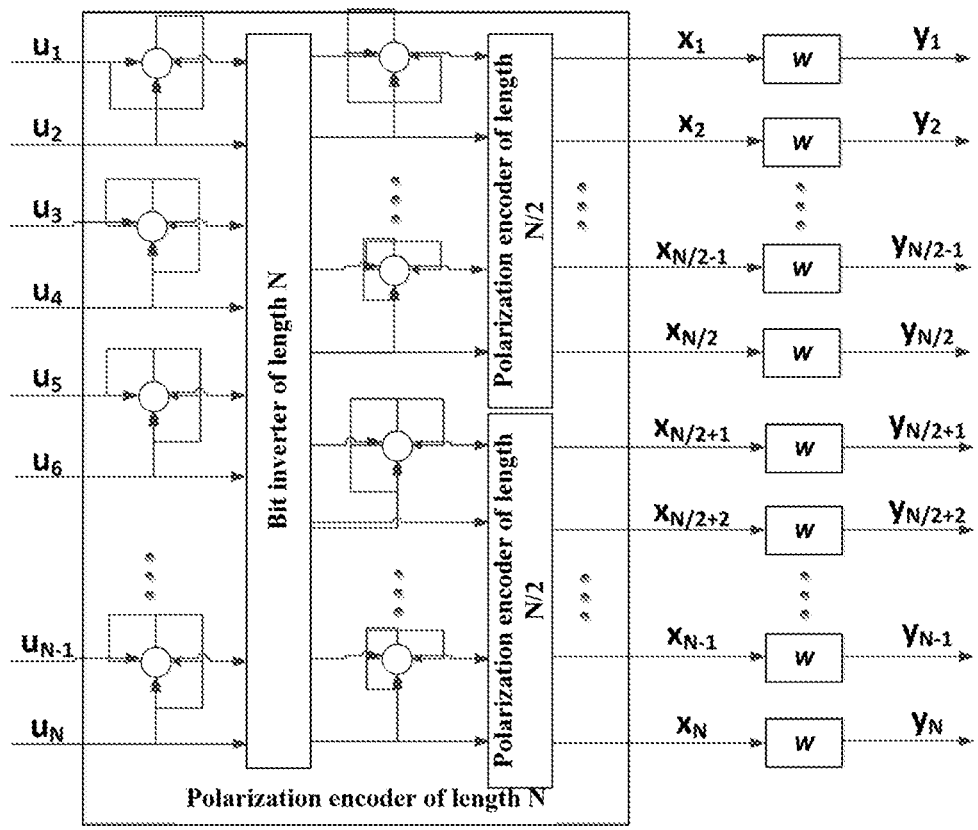
FIG. 1a is a schematic diagram of a recursive encoding structure of a Polar code in the related art.
Figure 1B:
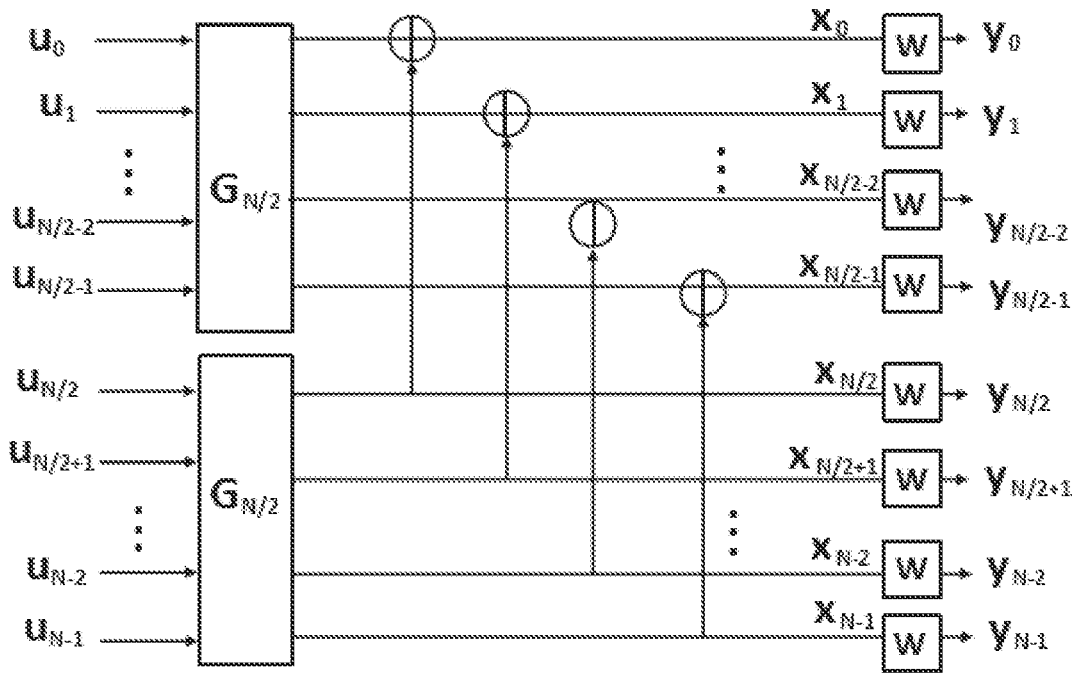
FIG. 1b is a schematic diagram of another recursive encoding structure of a Polar code in the related art.

The terms "first", "second" and the like in the description, claims and above drawings of the present application are used to distinguish between similar objects and are not necessarily used to describe a particular order or sequence. It should be understood that the data used in this way is interchangeable when appropriate so that embodiments of the present disclosure described herein can also be implemented in a sequence not illustrated or described herein. In addition, the terms "comprising", "including" or any other variations thereof described herein are intended to encompass a non-exclusive inclusion. For example, a process, method, system, product or device that includes a series of steps or elements not only includes the expressly listed steps or elements but may also include other steps or elements that are not expressly listed or are inherent to such a process, method, system, product or device.

Embodiment 1

A rate matching method for a Polar code is provided in this embodiment. The steps illustrated in the flowcharts in the accompanying drawings may be performed by a computer system such as a group of instructions executable to a computer. Although logical sequences are illustrated in the flowcharts, the illustrated or described steps may be performed in sequences different from those described herein in some cases.

In the above operating environment, the present disclosure provides the rate matching method for the Polar code shown in FIG. 3. FIG. 3 is a flowchart of a rate matching method for a Polar code according to this embodiment. As shown in FIG. 3, the method includes:

In 302, K information bits and (N−K) frozen bits are concatenated to generate a bit sequence of N bits, and the bit sequence of N bits is encoded by means of a Polar code encoder with a generator matrix of size N×N to generate an initial bit sequence {$S_0$, $S_1$, . . . , $S_{N-1}$} of N bits, where K and N are both positive integers and K is less than or equal to N.

The K information bits may be mapped onto a bit channel and may include a check bit.

In 304, a circular buffer is divided into q parts, bits are selected from the initial bit sequence {$S_0$, $S_1$, . . . , $S_{N-1}$} in a non-repeated manner, and the bits are written into the q parts of the circular buffer according to a predefined rule, where q=1, 2, 3 or 4.

In 306, a bit sequence of a specified length is sequentially selected from a predefined starting position in a bit sequence in the circular buffer and the bit sequence of the specified length is taken as a bit sequence to be transmitted.

In the above steps, a bit sequence is encoded by Polar encoder, a bit sequence after Polar encoding is processed according to a predefined rule to obtain the bit sequence in the circular buffer, and a bit sequence of a specified length is sequentially selected from a predefined starting position and taken as the bit sequence to be transmitted. In this way, proper processing and selecting rules are used to adapt to the transmission of data in different scenarios, thereby solving the problem in the related art that Polar code hardware has high complexity and has a complicated encoding process in a hybrid automatic repeat request mechanism, significantly reducing the complexity of Polar code hardware and simplifying the encoding process.

The circular buffer here may be a hardware circular buffer, and may also be a virtual device, which is not limited in this embodiment.

In some embodiments, a mother code of the Polar code has a length of N=$2^{-log_2(K/R)}$/(1+Δ), where ⌈ ⌉ represents a ceiling operation, 0≤Δ>2, and R is a code rate for the Polar encoding.

In some embodiments, the predefined rule for the initial bit sequence {$S_0$, $S_1$, . . . , $S_{N-1}$} is determined by a one-to-one mapping interleaving function f(n) generated according to a data characteristic of the Polar code, where n=0, 1, . . . , N−1, f(n)=0, 1, . . . , N−1, n is a bit position index in the initial bit sequence, and f(n) is a position index in the circular buffer; and a bit Sn with a bit position index n in the initial bit sequence is mapped onto a position with a position index f(n) in the circular buffer according to the one-to-one mapping interleaving function.

In some embodiments, the one-to-one mapping interleaving function f(n) has the following nesting characteristic: a mapping $\{n_0\} \rightarrow \{f(n_0)\}$ may be directly obtained by deleting an element greater than $N_0$ from a sequence $\{n\}$ and a sequence $\{f(n)\}$ in a mapping $\{n\} \rightarrow \{f(n)\}$ of the one-to-one mapping interleaving function, where $n_0 = 0, 1, 2, \ldots, N_0-1$ and $N_0$ is a positive integer less than or equal to N.

Since the mapping $\{n\} \rightarrow \{f(n)\}$ is a one-to-one mapping, an inverse function p(n) of f(n), which satisfies a mapping $\{p(n)\} \rightarrow \{n\}$, exists. That is, the predefined rule may be determined by a one-to-one mapping interleaving function p(n) generated according to the data characteristic of the Polar code, where $n=0, 1, \ldots, N-1$, $p(n)=0, 1, \ldots, N-1$, p(n) is a bit position index in the initial bit sequence, and n is a position index in the circular buffer. The step of selecting the bits from the initial bit sequence $\{S_0, S_1, \ldots, S_{N-1}\}$ in the non-repeated manner and writing the bits into the q parts of the circular buffer according to the predefined rule includes: mapping a bit $S_{p(n)}$ with a bit position index p(n) in the initial bit sequence onto a position with a position index n in the circular buffer according to the one-to-one mapping interleaving function p(n).

In some embodiments, the predefined rule for the initial bit sequence $\{S_0, S_1, \ldots, S_{N-1}\}$ may be performed by mapping the bit $S_n$ with the bit position index n in the initial bit sequence onto a position with a position index mod(f(n)+m, N) in the circular buffer according to the data characteristic of the Polar code, where $m=0, 1, \ldots, N-1$, m is an offset and $\mathrm{mod}(x_1, x_2)$ represents a remainder of a division $x_1/x_2$, where $x_1$ is an integer and $x_2$ is a positive integer.

In some embodiments, the data characteristic includes at least one of: a transport block length, a code rate, a number of available physical resource blocks, a modulation and coding level, a user equipment type index and a data transmission link direction.

In some embodiments, the predefined starting position is selected in one of the following manners:

A starting bit position of the bit sequence in the circular buffer is taken as the predefined starting position.

A position of $P_0=M-1$ in the circular buffer is taken as the predefined starting position, where $P_0$ represents a position index of the bit sequence in the circular buffer and M is a length of the bit sequence to be transmitted.

A position of $P_0=N-M$ in the circular buffer is taken as the predefined starting position, where $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

In some embodiments, the predefined starting position is determined by a code rate of the Polar encoding.

In some embodiments, the predefined starting position may be selected in the following manner:

When the code rate of the Polar encoding is less than or equal to a predefined threshold, the position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

It is to be noted that since the predefined starting position is determined by the code rate of the Polar encoding, when the code rate of the Polar encoding is greater than the predefined threshold, the predefined starting position is selected in one of the following manners:

The starting bit position of the bit sequence in the circular buffer is taken as the predefined starting position.

The position of $P_0=M-1$ in the circular buffer is taken as the predefined starting position, where $P_0$ represents the position index of the bit sequence in the circular buffer and M is the length of the bit sequence to be transmitted.

The ending bit position of the bit sequence in the circular buffer is taken as the predefined starting position.

When the circular buffer is composed of a sixth part, a seventh part, an eighth part and a ninth part arranged sequentially, a starting bit position of the seventh part of the bit sequence in the circular buffer is taken as the predefined starting position.

When the circular buffer is composed of the sixth part, the seventh part, the eighth part and the ninth part arranged sequentially, an ending bit position of the eighth part of the bit sequence in the circular buffer is taken as the predefined starting position.

When the circular buffer is composed of the sixth part, the seventh part, the eighth part and the ninth part arranged sequentially, a starting bit position of the eighth part of the bit sequence in the circular buffer is taken as the predefined starting position.

When the circular buffer is composed of the sixth part, the seventh part, the eighth part and the ninth part arranged sequentially, a starting bit position of the ninth part of the bit sequence in the circular buffer is taken as the predefined starting position.

When the circular buffer is composed of the sixth part, the seventh part, the eighth part and the ninth part arranged sequentially, if $M \leq t_8 + t_9$, a position of $P_0 = t_6 + t_7 + M - 1$ is taken as the predefined starting position; if $M > t_8 + t_9$, a position of $P_0 = M - 1 - t_8 - t_9$ is taken as the predefined starting position, where M is the length of the bit sequence to be transmitted, $t_6$ is a length in bits of the sixth part, $t_7$ is a length in bits of the seventh part, $t_8$ is a length in bits of the eighth part, and $t_9$ is a length in bits of the ninth part.

When the circular buffer is composed of the sixth part, the seventh part, the eighth part and the ninth part arranged sequentially, an ending bit position of the sixth part of the bit sequence in the circular buffer is taken as the predefined starting position.

When the circular buffer is composed of the sixth part, the seventh part, the eighth part and the ninth part arranged sequentially, if $M \leq t_8 + t_9$, a position of $P_0 = t_8 + t_9 - M$ is taken as the predefined starting position; if $M > t_8 + t_9$, a position of $P_0 = N + t_8 + t_9 - M$ is taken as the predefined starting position, where M is the length of the bit sequence to be transmitted, $t_6$ is the length in bits of the sixth part, $t_7$ is the length in bits of the seventh part, $t_8$ is the length in bits of the eighth part, and $t_9$ is the length in bits of the ninth part.

When the circular buffer is composed of the sixth part, the seventh part, the eighth part and the ninth part arranged sequentially, the starting bit position of the ninth part of the bit sequence in the circular buffer is taken as the predefined starting position.

When the circular buffer is composed of the sixth part, the seventh part, the eighth part and the ninth part arranged sequentially, an ending bit position of the seventh part of the bit sequence in the circular buffer is taken as the predefined starting position.

When the circular buffer is composed of the sixth part, the seventh part, the eighth part and the ninth part arranged sequentially, the ending bit position of the sixth part of the bit sequence in the circular buffer is taken as the predefined starting position.

In some embodiments, the predefined starting position may be selected in the following manner:

When the code rate of the Polar encoding is greater than the predefined threshold, the starting bit position of the bit sequence in the circular buffer is taken as the predefined starting position.

In some embodiments, the circular buffer includes a first part and a second part. The first part is composed of t1 continuous bits in the initial bit sequence in a sequential manner or in a bit reversal order (BRO) interleaving manner and the second part is composed of the remaining t2 bits in the initial bit sequence in the BRO interleaving manner, where t1 and t2 are both integers greater than or equal to 0, t1 ∈ [1/8N, 7/8N], t1+t2=N, N is a number of bits in the initial bit sequence, and N is an integer greater than or equal to 0.

Alternatively, the first part is composed of t2 continuous bits in the initial bit sequence in the BRO interleaving manner and the second part is composed of the remaining t1 bits in the initial bit sequence in the sequential manner or in the BRO interleaving manner, where t1 and t2 are both integers greater than or equal to 0, t1 ∈ [1/8N, 7/8N], t1+t2=N, N is the number of bits in the initial bit sequence, and N is an integer greater than or equal to 0.

The first part and the second part are sequentially arranged to form the bit sequence in the circular buffer.

In some embodiments, the initial bit sequence is written as $\{S_0, S_1, \ldots, S_{N-1}\}$, the first part is composed of t1 continuous bits $\{S_0, S_1, \ldots, S_{t_1-1}\}$ in the initial bit sequence in the sequential manner or in the BRO interleaving manner, and the second part is composed of the remaining $N-t_1$ continuous bits $\{S_{t_1}, S_{t_1+1}, \ldots, S_{N-1}\}$ in the initial bit sequence in the BRO interleaving manner.

Alternatively, the first part is composed of $N-t_1$ continuous bits $\{S_{N-1}, S_{N-2}, \ldots, S_{t_1}\}$ in the initial bit sequence in the BRO interleaving manner, and the second part is composed of the remaining t1 continuous bits $\{S_{t_1-1}, S_{t_1-2}, \ldots, S_0\}$ in the initial bit sequence in the sequential manner or in the BRO interleaving manner.

In some embodiments, the circular buffer includes a third part, a fourth part and a fifth part. The third part is composed of t3 continuous bits in the initial bit sequence in the sequential manner or in the BRO interleaving manner or in a row-column interleaving manner; the fourth part is determined in the following manner: two continuous bit sequences of length t4 are selected from the initial bit sequence and arranged in the BRO interleaving manner or in the row-column interleaving manner or in an interlace manner; and the fifth part is composed of t5 bits in the initial bit sequence, where t3, t4 and t5 are all integers greater than or equal to 0, t3+2×t4+t5=N, t3 ∈ [1/8N, 7/8N] and t4 ∈ [1/16N, 7/16N].

Alternatively, the third part is composed of t5 bits in the initial bit sequence in the sequential manner or in the BRO interleaving manner or in the row-column interleaving manner; the fourth part is determined in the following manner: two continuous bit sequences of length t4 are selected from the initial bit sequence and arranged in the BRO interleaving manner or in the row-column interleaving manner or in the interlace manner; and the fifth part is composed of the remaining t3 bits in the initial bit sequence, where t3, t4 and t5 are all integers greater than or equal to 0, t3+2×t4+t5=N, t3 ∈ [1/8N, 7/8N] and t4 ∈ [1/16N, 7/16N].

The third part, the fourth part and the fifth part are sequentially arranged to form the bit sequence in the circular buffer.

In some embodiments, the initial bit sequence is written as $\{S_0, S_1, \ldots, S_{N-1}\}$, the third part is composed of t3 continuous bits $\{S_0, S_1, \ldots, S_{t_3-1}\}$ in the sequential manner or in the BRO interleaving manner or in the row-column interleaving manner; the fourth part is composed of t4 bits $\{S_{N/4}, S_{N/4+1}, \ldots, S_{N/4+t_4-1}\}$ and t4 bits $\{S_{N/2}, S_{N/2+1}, \ldots, S_{N/2+t_4-1}\}$ in the BRO interleaving manner or in the row-column interleaving manner or in the interlace manner; and the fifth part is composed of the remaining $N-t_3-2\times t_4$ bits $\{S_{t_3}, S_{t_3+1}, \ldots, S_{N/4-1}\}$, $\{S_{N/4+t_4}, S_{N/4+t_4+1}, \ldots, S_{N/2-1}\}$ and $\{S_{N/2+t_4}, S_{N/2+t_4+1}, \ldots, S_{N-1}\}$ in the initial bit sequence in the sequential manner or in the BRO interleaving manner or in the row-column interleaving manner, where $\{S_{t_3}, S_{t_3+1}, \ldots, S_{N/4-1}\}=\emptyset$ for $t_3=N/4$ and $\{S_{N/4+t_4}, S_{N/4+t_4+1}, \ldots, S_{N/2-1}\}=\emptyset$ for $t_4=N/4$, where $\emptyset$ represents an empty set.

Alternatively, the third part is composed of $N-t_3-2\times t_4$ bits $\{S_{N-1}, S_{N-2}, \ldots, S_{N/2-t_4}\}$, $\{S_{N/2-1}, S_{N/2-2}, \ldots, S_{N/4+t_4}\}$ and $\{S_{N/4-1}, S_{M/4-2}, \ldots, S_{t_3}\}$ in the sequential manner or in the BRO interleaving manner or in the row-column interleaving manner; the fourth part is composed of t4 bits $\{S_{N/4+t_4-1}, S_{N/4+t_4-2}, \ldots, S_{N/4}\}$ and t4 bits $\{S_{N/2+t_4-1}, S_{N/2+t_4-2}, \ldots, S_{N/2}\}$ in the BRO interleaving manner or in the row-column interleaving manner or in the interlace manner; and the fifth part is composed of a bit sequence $\{S_{t_3-1}, S_{t_3-2}, \ldots, S_0\}$ in the sequential manner or in the BRO interleaving manner or in the row-column interleaving manner, where $\{S_{t_3}, S_{t_3+1}, \ldots, S_{N/4-1}\}=\emptyset$ for $t_3=N/4$ and $\{S_{N/4+t_4}, S_{N/4+t_4+1}, \ldots, S_{N/2-1}\}=\emptyset$ for $t_4=N/4$.

In some embodiments, the predefined starting position is selected in one of the following manners:

The starting bit position of the bit sequence in the circular buffer is taken as the predefined starting position.

The position of $P_0=M-1$ in the circular buffer is taken as the predefined starting position, where $P_0$ represents the position index of the bit sequence in the circular buffer and M is the length of the bit sequence to be transmitted.

The position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

The ending bit position of the bit sequence in the circular buffer is taken as the predefined starting position. In some embodiments, the circular buffer includes the sixth part, the seventh part, the eighth part and the ninth part. The sixth part is composed of $t_6$ bits in the initial bit sequence in the BRO interleaving manner, the seventh part is composed of $t_7$ bits in the initial bit sequence in the sequential manner or in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in [1/8N, 7/8N]$, $(t_8+t_9) \in [1/8N, 7/8N]$, and $t_6+t_7+t_8+t_9=N$.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the sequential manner or in the BRO interleaving manner, and the ninth part is composed of $t_6$ bits in the initial bit sequence in the BRO interleaving manner, where $t_6$, $t_7$, $t_8$ and $t_9$ are all integers greater than or equal to 0, $(t_6+t_7) \in [1/8N, 7/8N]$, $(t_8+t_9) \in [1/8N, 7/8N]$, and $t_6+t_7+t_8+t_9=N$.

In some embodiments, the initial bit sequence is written as $\{S_0, S_1, \ldots, S_{N-1}\}$; the sixth part is composed of $t_6$ bits $\{I_1\}$ in the BRO interleaving manner, where $\{I_1\}$ includes an intersection of a bit sequence set $\{S_0, S_1, \ldots, S_{0-1}\}$ and a bit sequence set $\{S_{BRO(j)}\}$, where a is an integer greater than or equal to 0 and less than or equal to N, $\{S_0, S_1, \ldots, S_{a-1}\}=\emptyset$ for a=0, j=M, ..., N−1, and M is the length of the bit sequence to be transmitted; the seventh part is composed of $t_7$ bits $\{I_2\}$ in the sequential manner or in the BRO interleaving manner, where $\{I_2\}$ is a difference set of the bit sequence set $\{S_0, S_1, \ldots, S_{a-1}\}$ and a bit sequence set $\{I_1\}$; the ninth part is composed of $t_9$ bits $\{I_4\}$ in the BRO interleaving manner, where $\{I_4\}$ includes an intersection of a bit sequence set $\{S_a, S_{a+1}, \ldots, S_{N-1}\}$ and the bit sequence set $\{S_{BRO(j)}\}$, and $\{S_a, S_{a+1}, \ldots, S_{N-1}\}=\emptyset$ for a=N; and the eighth part is composed of $t_8$ bits $\{I_3\}$ in the BRO interleaving manner, where $\{I_3\}$ is a difference set of the bit sequence set $\{S_a, S_{a+1}, \ldots, S_{N-1}\}$ and a bit sequence set $\{I_4\}$.

Alternatively, the initial bit sequence is written as $\{S_0, S_1, \ldots, S_{N-1}\}$; the sixth part is composed of $t_9$ bits $\{I_4\}$ in the BRO interleaving manner, where $\{I_4\}$ includes an intersection of a bit sequence set $\{S_{N-1}, S_{N-2}, \ldots, S_a\}$ and the bit sequence set $\{S_{BRO9j)}\}$, where a is an integer greater than or equal to 0 and less than or equal to N, j=N−1, N−2, ..., M, M is the length of the bit sequence to be transmitted and $\{S_{N-1}, S_{N-2}, \ldots, S_a\}=\emptyset$ for a=N; the seventh part is composed of $t_8$ bits $\{I_3\}$ in the BRO interleaving manner, where $\{I_3\}$ is a difference set of the bit sequence set $\{S_{N-1}, S_{N-2}, \ldots, S_a\}$ and the bit sequence set $\{I_4\}$; the ninth part is composed of $t_6$ bits $\{I_1\}$ in the sequential manner or in the BRO interleaving manner, where $\{I_1\}$ includes an intersection of a bit sequence set $\{S_{a-1}, S_{a-2}, \ldots, S_0\}$ and the bit sequence set and $\{S_{BRO(j)}\}$, and $\{S_0, S_1, \ldots, S_{a-1}\}=\emptyset$ for a=0; and the eighth part is composed of $t_7$ bits $\{I_2\}$ in the sequential manner or in the BRO interleaving manner, where $\{I_2\}$ is a difference set of the bit sequence set $\{S_{a-1}, S_{a-2}, \ldots, S_0\}$ and the bit sequence set $\{I_1\}$.

The sixth part, the seventh part, the eighth part and the ninth part are sequentially arranged to form the bit sequence in the circular buffer.

In some embodiments, the predefined starting position is selected according to the code rate of the Polar encoding.

In some embodiments, the predefined starting position is selected in one of the following manners:

When the code rate of the Polar encoding is less than or equal to the predefined threshold, the position of $P_0$=N−M is taken as the predefined starting position; when the code rate of the Polar encoding is greater than the predefined threshold, the starting bit position of the seventh part of the bit sequence in the circular buffer is taken as the predefined starting position.

When the code rate of the Polar encoding is less than or equal to the predefined threshold, the ending bit position of the bit sequence in the circular buffer is taken as the predefined starting position; when the code rate of the Polar encoding is greater than the predefined threshold, the ending bit position of the eighth part of the bit sequence in the circular buffer is taken as the predefined starting position.

When the code rate of the Polar encoding is less than or equal to the predefined threshold, the starting bit position of the bit sequence in the circular buffer is taken as the predefined starting position; when the code rate of Polar encoding code is greater than the predefined threshold, the starting bit position of the seventh part of the bit sequence in the circular buffer is taken as the predefined starting position.

When the code rate of the Polar encoding is less than or equal to the predefined threshold, the position of $P_0$=M−1 is taken as the predefined starting position; when the code rate of the Polar encoding is greater than the predefined threshold, the ending bit position of the eighth part of the bit sequence in the circular buffer is taken as the predefined starting position.

It is to be noted that the predefined starting position needs to be selected according to the code rate of the Polar encoding which may be seen from the above manners in which the predefined starting option is selected.

In some embodiments, the circular buffer includes the sixth part, the seventh part, the eighth part and the ninth part. The sixth part is composed of $t_6$ bits in the initial bit sequence in the sequential manner or in the BRO interleaving manner, the seventh part is composed of $t_7$ bits in the initial bit sequence in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in [1/8N, 7/8N]$, and $t_6+t_7+t_8+t_9=N$.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the BRO interleaving manner, and the ninth part is composed of $t_6$ bits in the initial bit sequence in the sequential manner or in the BRO interleaving manner, where $t_6$, $t_7$, $t_8$ and $t_9$ are all integers greater than or equal to 0, $(t_6+t_7) \in [1/8N, 7/8N]$, $(t_8+t_9) \in [1/8N, 7/8N]$, and $t_6+t_7+t_8+t_9=N$.

In some embodiments, the initial bit sequence is written as $\{S_0, S_1, \ldots, S_{N-1}\}$; the seventh part is composed of $t_7$ bits $\{I_2\}$ in the BRO interleaving manner, where $\{I_2\}$ includes an intersection of the bit sequence set $\{S_0, S_1, \ldots, S_{a-1}\}$ and the bit sequence set $\{S_{BRO(j)}\}$, where a is an integer greater than or equal to 0 and less than or equal to N, $\{S_0, S_1, \ldots, S_{a-1}\}=\emptyset$ for a=0, j=M, ..., N−1, and M is the length of the bit sequence to be transmitted; the sixth part is composed of $t_6$ bits $\{I_1\}$ in the sequential manner or in the BRO interleaving manner, where $\{I_1\}$ is a difference set of the bit sequence set $\{S_0, S_1, \ldots, S_{a-1}\}$ and a bit sequence set $\{I_2\}$; the eighth part is composed of $t_8$ bits $\{I_3\}$ in the BRO interleaving manner, where $\{I_3\}$ includes an intersection of thee bit sequence set $\{S_a, S_{a+1}, \ldots, S_{N-1}\}$ and the bit sequence set $\{S_{BRO(j)}\}$, and $\{S_a, S_{a+1}, \ldots, S_{N-1}\}=\emptyset$ for a=N; and the ninth part is composed of $t_9$ bits $\{I_4\}$ in the BRO interleaving manner, where $\{I_4\}$ is a difference set of the bit sequence set $\{S_a, S_{a+1}, \ldots, S_{N-1}\}$ and a bit sequence set $\{I_3\}$.

Alternatively, the initial bit sequence is written as $\{S_0, S_1, \ldots, S_{N-1}\}$; the seventh part is composed of $t_8$ bits $\{I_3\}$ in the BRO interleaving manner, where $\{I_3\}$ includes an intersection of the bit sequence set $\{S_{N-1}, S_{N-2}, \ldots, S_a\}$ and the bit sequence set $\{S_{BRO(j)}\}$, where a is an integer greater than or equal to 0 and less than or equal to N, $j \in \{M, \ldots, N-1\}$, M is the length of the bit sequence to be transmitted and $\{S_{N-1}, S_{N-2}, \ldots, S_a\}=\emptyset$ for a=N; the sixth part is composed of $t_9$ bits $\{I_4\}$ in the BRO interleaving manner, where $\{I_4\}$ is a difference set of the bit sequence set $\{S_{N-1}, S_{N-2}, \ldots, S_a\}$ and the bit sequence set $\{I_3\}$; the eighth part is composed of $t_7$ bits $\{I_2\}$ in the BRO interleaving manner, where $\{S_{i_2}\}$ includes an intersection of the bit sequence set $\{S_{a-1}, S_{a-2}, \ldots, S_0\}$ and the bit sequence set $\{S_{BRO(j)}\}$, and $\{S_{a-1}, S_{a-2}, \ldots, S_0\}=\emptyset$ for a=0; and the ninth part is composed of $t_6$ bits $\{I_1\}$ in the sequential manner or in the sequential manner or in the BRO interleaving manner, where $\{S_{i_1}\}$ is a difference set of the bit sequence set $\{S_{a-1}, S_{a-2}, \ldots, S_0\}$ and the bit sequence set $\{I_2\}$.

The sixth part, the seventh part, the eighth part and the ninth part are sequentially arranged to form the bit sequence in the circular buffer.

In some embodiments, the predefined starting position is selected in one of the following manners:

When the code rate of the Polar encoding is less than or equal to the predefined threshold, the starting bit position of the eighth part of the bit sequence in the circular buffer is taken as the predefined starting position; when the code rate of the Polar encoding is greater than the predefined threshold, the starting bit position of the ninth part of the bit sequence in the circular buffer is taken as the predefined starting position.

When the code rate of the Polar encoding is less than or equal to the predefined threshold, if $M<t_8+t_9$, the position of $P_0=t_6+t_7+M-1$ is taken as the predefined starting position, and if $M \geq t_8+t_9$, the position of $P_0=M-1-t_8-t_9$ is taken as the predefined starting position; when the code rate of the Polar encoding is greater than the predefined threshold, the ending bit position of the sixth part of the bit sequence in the circular buffer is taken as the predefined starting position.

When the code rate of the Polar encoding is less than or equal to the predefined threshold, if $M \leq t_8+t_9$, the position of $P_0=t_8+t_9\_M$ is taken as the predefined starting position, and if $M>t_8+t_9$, the position of $P_0=N+t_8+t_9-M$ is taken as the predefined starting position; when the code rate of the Polar encoding is greater than the predefined threshold, the starting bit position of the ninth part of the bit sequence in the circular buffer is taken as the predefined starting position.

When the code rate of the Polar encoding is less than or equal to the predefined threshold, the ending bit position of the seventh part of the bit sequence in the circular buffer is taken as the predefined starting position; when the code rate of the Polar encoding is greater than the predefined threshold, the ending bit position of the sixth part of the bit sequence in the circular buffer is taken as the predefined starting position.

It is to be noted that the predefined starting position needs to be selected according to the code rate of the Polar encoding which may be seen from the above manners in which the predefined starting option is selected.

In some embodiments, the predefined threshold is taken from a set $\{1/3, 1/2\}$, that is, the predefined threshold may be 1/3 or 1/2.

In some embodiments, the mother code of the Polar code has a length of $N=2^{\lceil \log_2(K/R) \rceil +m}$, where $\lceil \ \rceil$ represents a ceiling operation, R is a code rate, and m is a positive integer.

In some embodiments, the bit sequence in the circular buffer is obtained by performing BRO interleaving on the initial bit sequence $\{S_0, S_1, \ldots, S_{N-1}\}$, and a bit Sn with a bit position index n in the initial bit sequence is mapped onto a position with a position index $\mod(BRO(n)+m, N)$ in the circular buffer by means of a BRO interleaver, where n=0, 1, \ldots, N-1, m=0, 1, \ldots, N-1, m is an offset and $\mod(x1,x2)$ represents a remainder of a division x1/x2.

In some embodiments, the bit sequence in the circular buffer is obtained by performing the BRO interleaving on the initial bit sequence $\{S_0, S_1, \ldots, S_{N-1}\}$, and the bit Sn with the bit position index n in the initial bit sequence is mapped onto a position with a position index $N-1-\mod(BRO(n)+m, N)$ in the circular buffer by means of the BRO interleaver, where n=0, 1, \ldots, N-1, m=0, 1, \ldots, N-1, m is the offset and $\mod(x1,x2)$ represents the remainder of the division x1/x2.

In some embodiments, the predefined starting position is selected in one of the following manners:

The starting bit position of the bit sequence in the circular buffer is taken as the predefined starting position.

The position of $P_0=M-1$ in the circular buffer is taken as the predefined starting position, where $P_0$ represents the position index of the bit sequence in the circular buffer and M is the length of the bit sequence to be transmitted.

The position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

The ending bit position of the bit sequence in the circular buffer is taken as the predefined starting position.

In some embodiments, sequentially selecting the bit sequence of the specified length from the predefined starting position in the bit sequence in the circular buffer and taking the bit sequence of the specified length as the bit sequence to be transmitted includes the following step:

Bits are sequentially selected in an ascending or descending order of indexes from a predefined position in the bit sequence in the circular buffer, when reaching to an end of the bit sequence in the circular buffer, the selecting is continued from an other end of the bit sequence in the circular buffer until the bit sequence of the specified length is selected, and the bit sequence of the specified length is taken as the bit sequence to be transmitted.

For example, when the bits are read in an ascending order of indexes from the predefined starting position to the ending bit position of the bit sequence in the circular buffer, if the bit sequence of the specified length is not read, the reading is continued from the starting bit position of the bit sequence in the circular buffer until the bit sequence of the specified length is read and the bit sequence of the specified length is taken as the bit sequence to be transmitted. When the bits are read in a descending order of indexes from the predefined starting position to the starting bit position of the bit sequence in the circular buffer, if the bit sequence of the specified length is not read, the reading is continued from the ending bit position of the bit sequence in the circular buffer until the bit sequence of the specified length is read and the bit sequence of the specified length is taken as the bit sequence to be transmitted.

In some embodiments, when the code rate of the Polar encoding is less than or equal to the predefined threshold, the position of $P_0=N-M$ in the circular buffer is taken as the predefined starting position and M bits are sequentially selected in the ascending order of indexes; when the reading goes to an end of the bit sequence in the circular buffer, the reading is continued from the other end of the bit sequence in the circular buffer, where $P_0$ represents the position index of the bit sequence in the circular buffer, M is the length of the bit sequence to be transmitted, and N is the length of the initial bit sequence.

In some embodiments, when the code rate of the Polar encoding is greater than the predefined threshold, the starting bit position of the bit sequence in the circular buffer is taken as the predefined starting position and the M bits are sequentially selected in the ascending order of indexes; when the reading goes to an end of the bit sequence in the circular buffer, the reading is continued from the other end of the bit sequence in the circular buffer, where N is the length of the initial bit sequence.

A process for determining the predefined starting position may be applied to any one of the above cases where the circular buffer is divided into two parts, three parts and four parts, and may also be applied to any one of the first combination, the second combination, the third combination and the fourth combination, which are not limited in this embodiment.

In some embodiments, the bit sequence to be transmitted is arranged in a same order or in a reverse order of the bit sequence of the specified length read from the circular buffer.

The method in embodiments described above may be implemented by software plus a necessary general-purpose hardware platform, or may of course be implemented by hardware, but in many cases, the former is a preferred implementation mode. The content provided by this embodiment substantially, or the part contributing to the existing art, may be embodied in the form of a software product. The software product is stored on a storage medium (such as a ROM/RAM, a magnetic disk or an optical disk) and includes several instructions for enabling a terminal device (which may be a mobile phone, a computer, a server or a network device) to execute the method according to the embodiments described above.

Embodiment 2

This embodiment provides a rate matching device for a Polar code. The device may implement the method according to the embodiments described above. What has been described will not be repeated. As used below, the term "module" may be software, hardware or a combination thereof capable of implementing predetermined functions. The device in the embodiment described below is preferably implemented by software, but implementation by hardware or by a combination of software and hardware is also possible and conceived.

Figure 4:
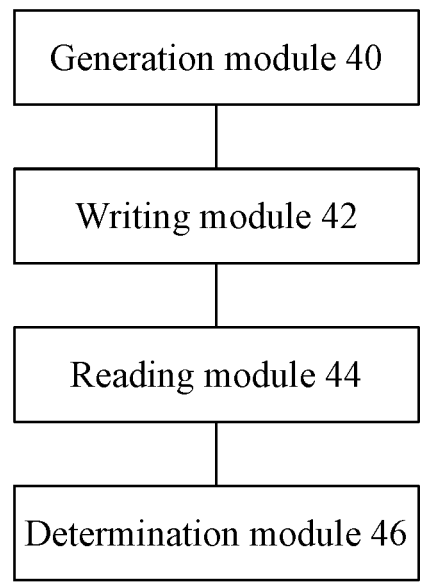
FIG. 4 is a block diagram of a rate matching device for a Polar rate according to an embodiment.

FIG. 4 is a block diagram of a device for processing a bit sequence according to this embodiment. As shown in FIG. 4, the device may include a generation module 40, a writing module 42, a reading module 44 and a determination module 46.

The generation module 40 is configured to concatenate K information bits and (N−K) frozen bits to generate a bit sequence of N bits and encode the bit sequence of N bits by means of a Polar code encoder with a generator matrix of size N×N to generate an initial bit sequence $\{S_0, S_1, \ldots, S_{N-1}\}$ of N bits, where K and N are both positive integers and K is less than or equal to N.

The writing module 42 is configured to divide a circular buffer into q parts, select bits from the initial bit sequence $\{S_0, S_1, \ldots, S_{N-1}\}$ in a non-repeated manner, and write the bits into the q parts of the circular buffer according to a predefined rule, where q=1, 2, 3 or 4.

The reading module 44 is configured to sequentially selected a bit sequence of a specified length from a predefined starting position in a bit sequence in the circular buffer.

The determination module 46 is configured to take the bit sequence of the specified length as a bit sequence to be transmitted.

In the above device, the generation module 40 may concatenate K bit channels as information bits with the (N−K) frozen bits to generate the bit sequence of N bits and encode the bit sequence of N bits by means of the Polar code encoder with the generator matrix of size N×N to generate the initial bit sequence of N bits; the writing module 41 divides the circular buffer into the q parts, select the bits from the initial bit sequence in the non-repeated manner, and write the bits into the q parts of the circular buffer according to the predefined rule; the reading module 44 sequentially selecteds the bit sequence of the specified length from the predefined starting position in the bit sequence in the circular buffer; and the determination module 46 takes the bit sequence of the specified length as the bit sequence to be transmitted. In this way, proper processing and reading rules are used to adapt to the transmission of data bits in different application scenarios, thereby solving the problem in the related art that Polar code hardware has high complexity and has a complicated encoding process in a hybrid automatic repeat request mechanism, significantly reducing the complexity of Polar code hardware and simplifying the encoding process.

In some embodiments, the predefined rule for the initial bit sequence $\{S_0, S_1, \ldots, S_{N-1}\}$ is determined by a one-to-one mapping interleaving function f(n) generated according to a data characteristic of the Polar code, where n=0, 1, ..., N−1, f(n)=0, 1, ..., N−1, n is a bit position index in the initial bit sequence, and f(n) is a position index in the circular buffer. The writing module is configured to map a bit Sn with a bit position index n in the initial bit sequence onto a position with a position index f(n) in the circular buffer according to the one-to-one mapping interleaving function f(n).

It is to be noted that since a mapping $\{n\} \rightarrow \{f(n)\}$ is a one-to-one mapping, an inverse function p(n) of f(n), which satisfies a mapping $\{p(n)\} \rightarrow \{n\}$, exists. That is, the predefined rule may be determined by a one-to-one mapping interleaving function p(n) generated according to the data characteristic of the Polar code, where n=0, 1, ..., N−1, p(n)=0, 1, ..., N−1, p(n) is a bit position index in the initial bit sequence, and n is a position index in the circular buffer. The step of selecting the bits from the initial bit sequence $\{S_0, S_1, \ldots, S_{N-1}\}$ in the non-repeated manner and writing the bits into the q parts of the circular buffer according to the predefined rule includes: mapping a bit $S_{p(n)}$ with a bit position index p(n) in the initial bit sequence onto a position with a position index n in the circular buffer according to the one-to-one mapping interleaving function p(n).

In some embodiments, the one-to-one mapping interleaving function f(n) has the following nesting characteristic:

a mapping $\{n_0\} \rightarrow \{f(n)\}$ may be directly obtained by deleting an element greater than $N_0$ from a sequence $\{n\}$ and a sequence $\{f(n)\}$ in the mapping $\{n\} \rightarrow \{f(n)\}$ of the one-to-one mapping interleaving function, where $n_0$=0, 1, 2, ..., $N_0$−1 and $N_0$ is a positive integer less than or equal to N.

In some embodiments, the predefined rule for the initial bit sequence $\{S_0, S_1, \ldots, S_{N-1}\}$ may be performed by mapping the bit $S_n$ with the bit position index n in the initial bit sequence onto a position with a position index mod(f(n)+m, N) in the circular buffer according to the data characteristic of the Polar code, where m=0, 1, ..., N−1, m is an offset and mod($x_1, x_2$) represents a remainder of a division $x_1/x_2$, where $x_1$ is an integer and $x_2$ is a positive integer.

In some embodiments, the predefined starting position is selected in one of the following manners:

A starting bit position of the bit sequence in the circular buffer is taken as the predefined starting position.

A position of $P_0$=M−1 in the circular buffer is taken as the predefined starting position, where $P_0$ represents a position index of the bit sequence in the circular buffer and M is a length of the bit sequence to be transmitted.

A position of $P_0=N-M$ in the circular buffer is taken as the predefined starting position, where $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

In some embodiments, the predefined starting position is selected according to a code rate of the Polar encoding.

In some embodiments, the predefined starting position may be selected in the following manner:

When the code rate of the Polar encoding is less than or equal to a predefined threshold, the position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

It is to be noted that since the predefined starting position is selected according to the code rate of the Polar encoding, when the code rate of the Polar encoding is greater than the predefined threshold, the predefined starting position is selected in one of the following manners:

The starting bit position of the bit sequence in the circular buffer is taken as the predefined starting position.

The position of $P_0=M-1$ in the circular buffer is taken as the predefined starting position, where $P_0$ represents the position index of the bit sequence in the circular buffer and M is the length of the bit sequence to be transmitted.

The ending bit position of the bit sequence in the circular buffer is taken as the predefined starting position.

When the circular buffer is composed of a sixth part, a seventh part, an eighth part and a ninth part arranged sequentially, a starting bit position of the seventh part of the bit sequence in the circular buffer is taken as the predefined starting position.

When the circular buffer is composed of the sixth part, the seventh part, the eighth part and the ninth part arranged sequentially, an ending bit position of the eighth part of the bit sequence in the circular buffer is taken as the predefined starting position.

When the circular buffer is composed of the sixth part, the seventh part, the eighth part and the ninth part arranged sequentially, a starting bit position of the eighth part of the bit sequence in the circular buffer is taken as the predefined starting position.

When the circular buffer is composed of the sixth part, the seventh part, the eighth part and the ninth part arranged sequentially, a starting bit position of the ninth part of the bit sequence in the circular buffer is taken as the predefined starting position.

When the circular buffer is composed of the sixth part, the seventh part, the eighth part and the ninth part arranged sequentially, if $M \leq t_8+t_9$, a position of $P_0=t_6+t_7+M-1$ is taken as the predefined starting position; if $M>t_8+t_9$, a position of $P_0=M-1-t_8-t_9$ is taken as the predefined starting position, where M is the length of the bit sequence to be transmitted, $t_6$ is a length in bits of the sixth part, $t_7$ is a length in bits of the seventh part, $t_8$ is a length in bits of the eighth part, and $t_9$ is a length in bits of the ninth part.

When the circular buffer is composed of the sixth part, the seventh part, the eighth part and the ninth part arranged sequentially, an ending bit position of the sixth part of the bit sequence in the circular buffer is taken as the predefined starting position.

When the circular buffer is composed of the sixth part, the seventh part, the eighth part and the ninth part arranged sequentially, if $M \leq t_8+t_9$, a position of $P_0=t_8+t_9-M$ is taken as the predefined starting position; if $M>t_8+t_9$, a position of $P_0=N+t_8+t_9-M$ is taken as the predefined starting position, where M is the length of the bit sequence to be transmitted, $t_6$ is the length in bits of the sixth part, $t_7$ is the length in bits of the seventh part, is is the length in bits of the eighth part, and $t_9$ is the length in bits of the ninth part.

When the circular buffer is composed of the sixth part, the seventh part, the eighth part and the ninth part arranged sequentially, the starting bit position of the ninth part of the bit sequence in the circular buffer is taken as the predefined starting position.

When the circular buffer is composed of the sixth part, the seventh part, the eighth part and the ninth part arranged sequentially, an ending bit position of the seventh part of the bit sequence in the circular buffer is taken as the predefined starting position.

When the circular buffer is composed of the sixth part, the seventh part, the eighth part and the ninth part arranged sequentially, the ending bit position of the sixth part of the bit sequence in the circular buffer is taken as the predefined starting position.

In some embodiments, the predefined starting position may be selected in the following manner:

When the code rate of the Polar encoding is greater than the predefined threshold, the starting bit position of the bit sequence in the circular buffer is taken as the predefined starting position.

In some embodiments, the circular buffer includes a first part and a second part. The first part is composed of t1 continuous bits in the initial bit sequence in a sequential manner or in a BRO interleaving manner and the second part is composed of the remaining t2 bits in the initial bit sequence in the BRO interleaving manner, where t1 and t2 are both integers greater than or equal to 0, t1 $\in$ [1/8N, 7/8N], t1+t2=N, N is a number of bits in the initial bit sequence, and N is an integer greater than or equal to 0.

Alternatively, the first part is composed of t2 continuous bits in the initial bit sequence in the BRO interleaving manner and the second part is composed of the remaining t1 bits in the initial bit sequence in the sequential manner or in the BRO interleaving manner, where t1and t2 are both integers greater than or equal to 0,t1 $\in$ [1/8N, 7/8N], t1+t2=N, N is the number of bits in the initial bit sequence, and N is an integer greater than or equal to 0.

The first part and the second part are sequentially arranged to form the bit sequence in the circular buffer.

In some embodiments, the circular buffer includes a third part, a fourth part and a fifth part. The third part is composed of t3 continuous bits in the initial bit sequence in the sequential manner or in the BRO interleaving manner or in a row-column interleaving manner; the fourth part is determined in the following manner: two continuous bit sequences of length t4 are selected from the initial bit sequence and arranged in the BRO interleaving manner or in the row-column interleaving manner or in an interlace manner; and the fifth part is composed of the remaining t5 bits in the initial bit sequence, where t3, t4 and t5 are all integers greater than or equal to 0, t3+2×t4+t5=N, t3 $\in$ [1/8N, 7/8N] and t4 $\in$ [1/16N, 7/16N].

Alternatively, the third part is composed of t5 bits in the initial bit sequence in the sequential manner or in the BRO interleaving manner or in the row-column interleaving manner; the fourth part is determined in the following manner: two continuous bit sequences of length t4 are selected from the initial bit sequence and arranged in the BRO interleaving manner or in the row-column interleaving manner or in the interlace manner; and the fifth part is composed of the remaining t3 bits in the initial bit sequence, where t3, t4 and t5 are all integers greater than or equal to 0, t3+2×t4+t5=N, t3 ∈ [1/8N, 7/8N] and t4 ∈[1/16N, 7/16N].

The third part, the fourth part and the fifth part are sequentially arranged to form the bit sequence in the circular buffer.

In some embodiments, the predefined starting position is selected in one of the following manners:

The starting bit position of the bit sequence in the circular buffer is taken as the predefined starting position.

The position of $P_0$=M−1 in the circular buffer is taken as the predefined starting position, where $P_0$ represents the position index of the bit sequence in the circular buffer and M is the length of the bit sequence to be transmitted.

The position of $P_0$=N−M in the circular buffer is taken as the predefined starting position, where $P_0$ represents the position index of the bit sequence in the circular buffer, M is the length of the bit sequence to be transmitted, and N is the length of the initial bit sequence.

The ending bit position of the bit sequence in the circular buffer is taken as the predefined starting position.

In some embodiments, the circular buffer includes the sixth part, the seventh part, the eighth part and the ninth part. The sixth part is composed of $t_6$ bits in the initial bit sequence in the BRO interleaving manner, the seventh part is composed of $t_7$ bits in the initial bit sequence in the sequential manner or in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6 t_7+t_8+t_9$=N.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the sequential manner or in the BRO interleaving manner, and the ninth part is composed of $t_6$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

In some embodiments, the circular buffer includes the sixth part, the seventh part, the eighth part and the ninth part. The sixth part is composed of $t_6$ bits in the initial bit sequence in the sequential manner or in the BRO interleaving manner, the seventh part is composed of $t_7$ bits in the initial bit sequence in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the BRO interleaving manner, and the ninth part is composed of $t_6$ bits in the initial bit sequence in the sequential manner or in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

In some embodiments, a mother code of the Polar code has a length of N=$2^{\lceil log_2(K/R) \rceil + m}$, where $\lceil \ \rceil$ represents a ceiling operation and m is a positive integer.

In some embodiments, the bit sequence in the circular buffer is obtained by performing BRO interleaving on the initial bit sequence $\{S_0, S_1, \ldots, S_{N-1}\}$, and a bit Sn with a bit position index n in the initial bit sequence is mapped onto a position with a position index mod(BRO(n)+m, N) in the circular buffer by means of a BRO interleaver, where n=0, 1, ..., N−1, m=0, 1, ..., N−1, m is an offset and mod(x1,x2) represents a remainder of a division x1/x2.

In some embodiments, the bit sequence in the circular buffer is obtained by performing the BRO interleaving on the initial bit sequence $\{S_0, S_1, \ldots, S_{N-1}\}$, and the bit Sn with the bit position index n in the initial bit sequence is mapped onto a position with a position index N−1−mod (BRO(n)+m, N) in the circular buffer by means of the BRO interleaver, where n=0, 1, ..., N−1, m=0, 1, ..., N−1, m is the offset and mod(x1,x2) represents the remainder of the division x1/x2.

Embodiment 3

This embodiment provides a rate matching device for a Polar code to illustrate an application body of the device in the embodiments described above. The system may implement the method according to the embodiments described above. What has been described will not be repeated in this embodiment.

Figure 5:
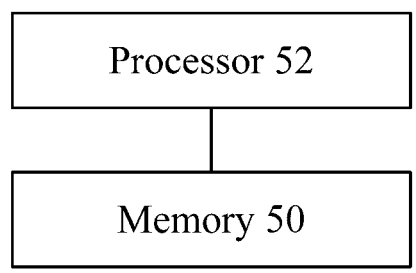
FIG. 5 is a block diagram of another rate matching device for a Polar rate according to an embodiment.

FIG. 5 is a block diagram of a device for processing a bit sequence according to this embodiment. As shown in FIG. 5, the device may include a processor 50 and a memory 52.

The memory 52 is configured to store instructions executable by the processor. The processor 50 is configured to perform, according to the instructions sored in the memory, the following operations: K bit channels used as information bits and (N−K) frozen bits are concatenated to generate a bit sequence of N bits, and the bit sequence of N bits is encoded by means of a Polar code encoder with a generator matrix of size N×N to generate an initial bit sequence $\{S_0, S_1, \ldots, S_{N-1}\}$ of N bits, where K and N are both positive integers and K is less than or equal to N; a circular buffer is divided into q parts, bits are selected from the initial bit sequence $\{S_0, S_1, \ldots, S_{N-1}\}$ in a non-repeated manner, and the bits are written into each part of the circular buffer according to a predefined rule, where q=1, 2, 3 or 4; and a bit sequence of a specified length is sequentially selected from a predefined starting position in a bit sequence in the circular buffer and the bit sequence of the specified length is taken as a bit sequence to be transmitted.

In the above device, Polar code is performed on a bit sequence to be transmitted, the bit sequence subject to the Polar code is processed according to a predefined rule to obtain the bit sequence in the circular buffer, and the bit sequence of the specified length is sequentially selected from the predefined starting position and taken as the bit sequence to be transmitted. In this way, proper processing and reading rules are used to adapt to the transmission of data bits in different application scenarios, thereby solving the problem in the related art that Polar code hardware has high complexity and has a complicated encoding process in a hybrid automatic repeat request mechanism, significantly reducing the complexity of Polar code hardware and simplifying the encoding process.

In some embodiments, the processor is further configured to perform, according to the instructions sored in the memory, the following operations: the predefined rule for the initial bit sequence $\{S_0, S_1, \ldots, S_{N-1}\}$ is determined by a one-to-one mapping interleaving function f(n) generated according to a data characteristic of the Polar code, where n=0, 1, ..., N−1, f(n)=0, 1, ..., N−1, n is a bit position index in the initial bit sequence, and f(n) is a position index in the circular buffer; and a bit Sn with a bit position index n in the initial bit sequence is mapped onto a position with a position index f(n) in the circular buffer according to the one-to-one mapping interleaving function f(n).

It is to be noted that since a mapping $\{n\} \rightarrow \{f(n)\}$ is a one-to-one mapping, an inverse function p(n) of f(n), which satisfies a mapping $\{p(n)\} \rightarrow \{n\}$, exists. That is, the predefined rule may be determined by a one-to-one mapping interleaving function p(n) generated according to the data characteristic of the Polar code, where n=0, 1, ..., N−1, p(n)=0, 1, ..., N−1, p(n) is a bit position index in the initial bit sequence, and n is a position index in the circular buffer. The operation of selecting the bits from the initial bit sequence $\{S_0, S_1, \ldots, S_{N-1}\}$ in the non-repeated manner and writing the bits into the q parts of the circular buffer according to the predefined rule includes: mapping a bit $S_{p(n)}$ with a bit position index p(n) in the initial bit sequence onto a position with a position index n in the circular buffer according to the one-to-one mapping interleaving function p(n).

In some embodiments, the one-to-one mapping interleaving function f(n) has the following nesting characteristic:

a mapping $\{n_0\} \rightarrow \{f(n_0)\}$ may be directly obtained by deleting an element greater than $N_0$ from a sequence $\{n\}$ and a sequence $\{f(n)\}$ in the mapping $\{n\} \rightarrow \{f(n)\}$ of the one-to-one mapping interleaving function, where $n_0$=0, 1, 2, . . ., $N_0$−1 and $N_0$ is a positive integer less than or equal to N.

In some embodiments, the predefined rule for the initial bit sequence $\{S_0, S_1, \ldots, S_{N-1}\}$ may be performed by mapping the bit $S_n$ with the bit position index n in the initial bit sequence onto a position with a position index mod(f(n)+m, N) in the circular buffer according to the data characteristic of the Polar code, where m=0, 1, ..., N−1, m is an offset and mod($x_1, x_2$) represents a remainder of a division $x_1/x_2$, where $x_1$ is an integer and $x_2$ is a positive integer.

In some embodiments, the predefined starting position is selected in one of the following manners:

A starting bit position of the bit sequence in the circular buffer is taken as the predefined starting position.

A position of $P_0$=M−1 in the circular buffer is taken as the predefined starting position, where $P_0$ represents a position index of the bit sequence in the circular buffer and M is a length of the bit sequence to be transmitted.

A position of $P_0$=N−M in the circular buffer is taken as the predefined starting position, where $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

In some embodiments, the predefined starting position is selected according to a code rate of the Polar encoding.

In some embodiments, the predefined starting position may be selected in the following manner:

When the code rate of the Polar encoding is less than or equal to a predefined threshold, the position of $P_0$=N−M in the circular buffer is taken as the predefined starting position, where $P_0$ represents the position index of the bit sequence in the circular buffer, M is the length of the bit sequence to be transmitted, and N is the length of the initial bit sequence.

In some embodiments, the predefined starting position may be selected in the following manner:

When the code rate of the Polar encoding is greater than the predefined threshold, the starting bit position of the bit sequence in the circular buffer is taken as the predefined starting position.

In some embodiments, the circular buffer includes a first part and a second part. The first part is composed of t1 continuous bits in the initial bit sequence in a sequential manner or in a BRO interleaving manner and the second part is composed of the remaining t2 bits in the initial bit sequence in the BRO interleaving manner, where t1 and t2 are both integers greater than or equal to 0, t1 ∈ [1/8N, 7/8N], t1+t2=N, N is a number of bits in the initial bit sequence, and N is an integer greater than or equal to 0.

Alternatively, the first part is composed of t2 continuous bits in the initial bit sequence in the BRO interleaving manner and the second part is composed of the remaining t1 bits in the initial bit sequence in the sequential manner or in the BRO interleaving manner, where t1 and t2 are both integers greater than or equal to 0, t1 ∈ [1/8N , 7/8N], t1+t2=N, N is the number of bits in the initial bit sequence, and N is an integer greater than or equal to 0.

The first part and the second part are sequentially arranged to form the bit sequence in the circular buffer.

In some embodiments, the circular buffer includes a third part, a fourth part and a fifth part. The third part is composed of t3 continuous bits in the initial bit sequence in the sequential manner or in the BRO interleaving manner or in a row-column interleaving manner; the fourth part is determined in the following manner: two continuous bit sequences of length t4 are selected from the initial bit sequence and arranged in the BRO interleaving manner or in the row-column interleaving manner or in an interlace manner; and the fifth part is composed of t5 bits in the initial bit sequence, where t3, t4 and t5 are all integers greater than or equal to 0, t3+2×t4+t5=N, t3 ∈ [1/8N, 7/8N] and t4 ∈ [1/16N, 7/16N].

Alternatively, the third part is composed of t5 bits in the initial bit sequence in the sequential manner or in the BRO interleaving manner or in the row-column interleaving manner; the fourth part is determined in the following manner: two continuous bit sequences of length t4 are selected from the initial bit sequence and arranged in the BRO interleaving manner or in the row-column interleaving manner or in the interlace manner; and the fifth part is composed of the remaining t3 bits in the initial bit sequence, where t3, t4 and t5 are all integers greater than or equal to 0, t3+2×t4+t5=N, t3 ∈ [1/8N, 7/8N] and t4 ∈ [1/16N, 7/16N].

The third part, the fourth part and the fifth part are sequentially arranged to form the bit sequence in the circular buffer.

In some embodiments, the predefined starting position is selected in one of the following manners:

The starting bit position of the bit sequence in the circular buffer is taken as the predefined starting position.

The position of $P_0$=M−1 in the circular buffer is taken as the predefined starting position, where $P_0$ represents the position index of the bit sequence in the circular buffer and M is the length of the bit sequence to be transmitted.

The position of $P_0$=N−M in the circular buffer is taken as the predefined starting position, where $P_0$ represents the position index of the bit sequence in the circular buffer, M is the length of the bit sequence to be transmitted, and N is the length of the initial bit sequence.

The ending bit position of the bit sequence in the circular buffer is taken as the predefined starting position.

In some embodiments, the circular buffer includes a sixth part, a seventh part, an eighth part and a ninth part. The sixth part is composed of $t_6$ bits in the initial bit sequence in the BRO interleaving manner, the seventh part is composed of $t_7$ bits in the initial bit sequence in the sequential manner or in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in [1/8N 7/8N]$, $(t_8+t_9) \in [1/8N, 7/8N]$, and $t_6+t_7+t_8+t_9=N$.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the sequential manner or in the BRO interleaving manner, and the ninth part is composed of $t_6$ bits in the initial bit sequence in the BRO interleaving manner, where $t_6$, $t_7$, $t_8$ and $t_9$ are all integers greater than or equal to 0, $(t_6+t_7) \in [1/8N, 7/8N]$, $(_8+t_9) \in [1/8N, 7/8N]$, and $t_6+t_7+t_8+t_9=N$.

In some embodiments, the circular buffer includes the sixth part, the seventh part, the eighth part and the ninth part. The sixth part is composed of $t_6$ bits in the initial bit sequence in the sequential manner or in the BRO interleaving manner, the seventh part is composed of $t_7$ bits in the initial bit sequence in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in [1/8N, 7/8N]$, $(_8+t_9) \in [1/8N, 7/8N]$, and $t_6+t_7+t_8+t_9=N$.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the BRO interleaving manner, and the ninth part is composed of $t_6$ bits in the initial bit sequence in the sequential manner or in the BRO interleaving manner, where $t_6$, $t_7$, $t_8$ and $t_9$ are all integers greater than or equal to 0, $(t_6+t_7) \in [1/8N, 7/8N]$, $(t_8+t_9) \in [1/8N, 7/8N]$, and $t_6+t_7+t_8+t_9=N$.

In some embodiments, a mother code of the Polar code has a length of $N=2^{\lceil log_2(K/R) \rceil+m}$, where $\lceil \ \rceil$ represents a ceiling operation, R is a code rate, and m is a positive integer.

In some embodiments, the bit sequence in the circular buffer is obtained by performing BRO interleaving on the initial bit sequence $\{S_0, S_1, \ldots, S_{N-1}\}$, and a bit $S_n$ with a bit position index n in the initial bit sequence is mapped onto a position with a position index $mod(BRO(n)+m, N)$ in the circular buffer by means of a BRO interleaver, where $n=0, 1, \ldots, N-1$, $m=0, 1, \ldots, N-1$, m is an offset and $mod(x1, x2)$ represents a remainder of a division $x1/x2$.

In some embodiments, the bit sequence in the circular buffer is obtained by performing the BRO interleaving on the initial bit sequence $\{S_0, S_1, \ldots, S_{N-1}\}$, and the bit Sn with the bit position index n in the initial bit sequence is mapped onto a position with a position index $N-1-mod(BRO(n)+m, N)$ in the circular buffer by means of the BRO interleaver, where $n=0, 1, \ldots, N-1$, $m=0, 1, \ldots, N-1$, m is the offset and $mod(x1,x2)$ represents the remainder of the division $x1/x2$.

In some embodiments, the processor is further configured to perform, according to the instructions sored in the memory, the following operations: the predefined rule for the initial bit sequence $\{S_0, S_1, \ldots, S_{N-1}\}$ is determined by a one-to-one mapping interleaving function f(n) generated according to a data characteristic of the Polar code, where $n=0, 1, \ldots, N-1$, $f(n)=0, 1, \ldots, N-1$, n is a bit position index in the initial bit sequence, and f(n) is a position index in the circular buffer; and a bit Sn with a bit position index n in the initial bit sequence is mapped onto a position with a position index f(n) in the circular buffer according to the one-to-one mapping interleaving function f(n).

In some embodiments, the predefined rule may be determined by a one-to-one mapping interleaving function p(n) generated according to the data characteristic of the Polar code, where $n=0, 1, \ldots, N-1$, $p(n)=0, 1, \ldots, N-1$, p(n) is a bit position index in the initial bit sequence, and n is a position index in the circular buffer. The operation of selecting the bits from the initial bit sequence $\{S_0, S_1, \ldots, S_{N-1}\}$ in the non-repeated manner and writing the bits into the q parts of the circular buffer according to the predefined rule includes: mapping a bit Sp(n) with a bit position index p(n) in the initial bit sequence onto a position with a position index n in the circular buffer according to the one-to-one mapping interleaving function p(n).

In some embodiments, the one-to-one mapping interleaving function f(n) has the following nesting characteristic:

a mapping $\{n_0\} \to \{f(n_0)\}$ may be directly obtained by deleting an element greater than $N_0$ from a sequence $\{n\}$ and a sequence $\{f(n)\}$ in the mapping $\{n\} \to \{f(n)\}$ of the one-to-one mapping interleaving function, where $n_0=0, 1, 2, \ldots, N_{00}-1$ and $N_0$ is a positive integer less than or equal to N.

In some embodiments, the predefined rule for the initial bit sequence $\{S_0, S_1, \ldots, S_{N-1}\}$ may be performed by mapping the bit $S_n$ with the bit position index n in the initial bit sequence onto a position with a position index $mod(f(n)+m, N)$ in the circular buffer according to the data characteristic of the Polar code, where $m=0, 1, \ldots, N-1$, m is an offset and $mod(x_1, x_2)$ represents a remainder of a division $x_1/x_2$, where xi is an integer and $x_2$ is a positive integer.

In some embodiments, the predefined starting position is selected in one of the following manners:

A starting bit position of the bit sequence in the circular buffer is taken as the predefined starting position.

A position of $P_0=M-1$ in the circular buffer is taken as the predefined starting position, where $P_0$ represents a position index of the bit sequence in the circular buffer and M is a length of the bit sequence to be transmitted.

A position of $P_0=N-M$ in the circular buffer is taken as the predefined starting position, where $P_0$ represents the position index of the bit sequence in the circular buffer, M is the length of the bit sequence to be transmitted, and N is a length of the initial bit sequence.

An ending bit position of the bit sequence in the circular buffer is taken as the predefined starting position.

In some embodiments, the predefined starting position is selected according to a code rate of the Polar encoding.

In some embodiments, the predefined starting position may be selected in the following manner:

When the code rate of the Polar encoding is less than or equal to a predefined threshold, the position of $P_0=N-M$ in the circular buffer is taken as the predefined starting position, where $P_0$ represents the position index of the bit sequence in the circular buffer, M is the length of the bit sequence to be transmitted, and N is the length of the initial bit sequence.

The predefined starting position may be selected in the following manner:

When the code rate of the Polar encoding is greater than the predefined threshold, the starting bit position of the bit sequence in the circular buffer is taken as the predefined starting position.

In some embodiments, the circular buffer includes a first part and a second part. The first part is composed of t1 continuous bits in the initial bit sequence in a sequential manner or in a BRO interleaving manner and the second part is composed of the remaining t2 bits in the initial bit sequence in the BRO interleaving manner, where t1 and t2 are both integers greater than or equal to 0, t1 $\in$ [1/8N, 7/8N], t1+t2=N, N is a number of bits in the initial bit sequence, and N is an integer greater than or equal to 0.

Alternatively, the first part is composed of t2 continuous bits in the initial bit sequence in the BRO interleaving manner and the second part is composed of the remaining t1 bits in the initial bit sequence in the sequential manner or in the BRO interleaving manner, where t1 and t2 are both integers greater than or equal to 0, t1 $\in$ [1/8N, 7/8N], t1+t2=N, N is the number of bits in the initial bit sequence, and N is an integer greater than or equal to 0.

The first part and the second part are sequentially arranged to form the bit sequence in the circular buffer.

In some embodiments, the circular buffer includes a third part, a fourth part and a fifth part. The third part is composed of t3 continuous bits in the initial bit sequence in the sequential manner or in the BRO interleaving manner or in a row-column interleaving manner; the fourth part is determined in the following manner: two continuous bit sequences of length t4 are selected from the initial bit sequence and arranged in the BRO interleaving manner or in the row-column interleaving manner or in an interlace manner; and the fifth part is composed of t5 bits in the initial bit sequence, where t3, t4 and t5 are all integers greater than or equal to 0, t3+2×t4+t5=N, t3 $\in$ [1/8N, 7/8N] and t4 $\in$ [1/16N, 7/16N].

Alternatively, the third part is composed of t5 bits in the initial bit sequence in the sequential manner or in the BRO interleaving manner or in the row-column interleaving manner; the fourth part is determined in the following manner: two continuous bit sequences of length t4 are selected from the initial bit sequence and arranged in the BRO interleaving manner or in the row-column interleaving manner or in the interlace manner; and the fifth part is composed of the remaining t3 bits in the initial bit sequence, where t3, t4 and t5 are all integers greater than or equal to 0, t3+2×t4+t5=N, t3 $\in$ [1/8N, 7/8N] and t4 $\in$ [1/16N, 7/16N].

The third part, the fourth part and the fifth part are sequentially arranged to form the bit sequence in the circular buffer.

In some embodiments, the predefined starting position is selected in one of the following manners:

The starting bit position of the bit sequence in the circular buffer is taken as the predefined starting position.

The position of $P_0$=M−1 in the circular buffer is taken as the predefined starting position, where $P_0$ represents the position index of the bit sequence in the circular buffer and M is the length of the bit sequence to be transmitted.

The position of $P_0$=N−M in the circular buffer is taken as the predefined starting position, where $P_0$ represents the position index of the bit sequence in the circular buffer, M is the length of the bit sequence to be transmitted, and N is the length of the initial bit sequence.

The ending bit position of the bit sequence in the circular buffer is taken as the predefined starting position.

In some embodiments, the circular buffer includes a sixth part, a seventh part, an eighth part and a ninth part. The sixth part is composed of $t_6$ bits in the initial bit sequence in the BRO interleaving manner, the seventh part is composed of $t_7$ bits in the initial bit sequence in the sequential manner or in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the sequential manner or in the BRO interleaving manner, and the ninth part is composed of $t_6$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

In some embodiments, the circular buffer includes the sixth part, the seventh part, the eighth part and the ninth part. The sixth part is composed of $t_6$ bits in the initial bit sequence in the sequential manner or in the BRO interleaving manner, the seventh part is composed of $t_7$ bits in the initial bit sequence in the BRO interleaving manner, the eighth part is composed of $t_8$ bits in the initial bit sequence in the BRO interleaving manner, and the ninth part is composed of $t_9$ bits in the initial bit sequence in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

Alternatively, the sixth part is composed of $t_9$ bits in the initial bit sequence in the BRO interleaving manner, the seventh part is composed of $t_8$ bits in the initial bit sequence in the BRO interleaving manner, the eighth part is composed of $t_7$ bits in the initial bit sequence in the BRO interleaving manner, and the ninth part is composed of $t_6$ bits in the initial bit sequence in the sequential manner or in the BRO interleaving manner, where $t_6$, $t_7$, $t_8$ and $t_9$ are all integers greater than or equal to 0, $(t_6+t_7) \in$ [1/8N, 7/8N], $(t_8+t_9) \in$ [1/8N, 7/8N], and $t_6+t_7+t_8+t_9$=N.

In some embodiments, a mother code of the Polar code has a length of N=$2^{\lceil log_2(K/R) \rceil + m}$, where $\lceil \ \rceil$ represents a ceiling operation, R is a code rate, and m is a positive integer.

In some embodiments, the bit sequence in the circular buffer is obtained by performing BRO interleaving on the initial bit sequence $\{S_0, S_1, \ldots, S_{N-1}\}$, and a bit $S_n$ with a bit position index n in the initial bit sequence is mapped onto a position with a position index mod(BRO(n)+m, N) in the circular buffer by means of a BRO interleaver, where n=0, 1, ..., N−1, m=0, 1, ..., N−1, m is an offset and mod(x1,x2) represents a remainder of a division x1/x2.

In some embodiments, the bit sequence in the circular buffer is obtained by performing the BRO interleaving on the initial bit sequence $\{S_0, S_1, \ldots, S_{N-1}\}$, and the bit Sn with the bit position index n in the initial bit sequence is mapped onto a position with a position index N−1−mod (BRO(n)+m, N) in the circular buffer by means of the BRO interleaver, where n=0, 1, ..., N−1, m=0, 1, ..., N−1, m is the offset and mod(x1,x2) represents the remainder of the division x1/x2.

Examples are given below to illustrate the processing methods and implementation modes in the embodiments described above in this embodiment.

EXAMPLE 1

1. Polar code is performed on an information bit sequence of length K=4 using code rate R=2/3, and a length of the encoded bit sequence is N=$2^{\lceil log_2(K/R) \rceil}$=$2^{\lceil log_2(4 \times 3/2) \rceil}$=8.

2. A mapping function for mapping the initial bit sequence is determined by a BRO operation (which is not limited herein) to obtain the bit sequence $\{S_0, S_4, S_2, S_6, S_1, S_5, S_3, S_7\}$ in the circular buffer.

3. Six bits $\{S_0, S_4, S_2, S_6, S_1, S_5\}$ are read in an ascending order of indexes from a starting position in the circular buffer.

4. The six data bits $\{S_0, S_4, S_2, S_6, S_1, S_5\}$ are sequentially arranged and transmitted as a rate matching data bit sequence to be transmitted.

EXAMPLE 2

Step 1 and step 2 are the same as those in the example 1.

3. Six bits $\{S_5, S_1, S_6, S_2, S_4, S_0\}$ are read in a descending order of indexes from a position with a position index P0=M−1=5 in the circular buffer.

4. The six data bits $\{S_5, S_1, S_6, S_2, S_4, S_0\}$ are reversely arranged and transmitted as the rate matching data bit sequence to be transmitted.

EXAMPLE 3

Step 1 and step 2 are the same as those in the example 1.

3. Six bits $\{S_2, S_6, S_1, S_5, S_3, S_7\}$ are read in the ascending order of indexes from a position with a position index P0=N−M=2 in the circular buffer.

4. The six data bits $\{S_2, S_6, S_1, S_5, S_3, S_7\}$ are sequentially arranged and transmitted as the rate matching data bit sequence to be transmitted.

EXAMPLE 4

Step 1 and step 2 are the same as those in the example 1.

3. Six bits $\{S_7, S_3, S_5, S_1, S_6, S_2\}$ are read in the descending order of indexes from an ending position in the circular buffer.

4. The six data bits $\{S_7, S_3, S_5, S_1, S_6, S_2\}$ are reversely arranged and transmitted as the rate matching data bit sequence to be transmitted.

EXAMPLE 5

Step 1 is the same as that in the example 1.

2. The bit sequence in the circular buffer obtained in the example 1 is reversely arranged to obtain $\{S_7, S_3, S_5, S_1, S_6, S_2, S_4, S_0\}$.

Step 3 and step 4 are the same as those in the example 1.

EXAMPLE 6

Step 1 and step 2 are the same as those in the example 5.
Step 3 and step 4 are the same as those in the example 2.

EXAMPLE 7

Step 1 and step 2 are the same as those in the example 5.
Step 3 and step 4 are the same as those in the example 3.

EXAMPLE 8

Step 1 and step 2 are the same as those in the example 5.
Step 3 and step 4 are the same as those in the example 4.

EXAMPLE 9

1. The Polar code is performed on an information bit sequence of length K=2 using code rate R=2/3, and the length of the encoded bit sequence is N=$2^{\lceil log_2(K/R) \rceil}$= $2^{\lceil log_2(2 \times 3/2) \rceil}$=4.

2. According to a BRO nesting characteristic of the mapping function of the initial bit sequence, elements with position indexes greater than or equal to 4 may be directly deleted from the bit sequence in the circular buffer in the example 1 to obtain the bit sequence $\{S_0, S_2, S_1, S_3\}$ in the circular buffer.

3. Three bits $\{S_0, S_2, S_1\}$ are read in the ascending order of indexes from the starting position in the circular buffer.

4. The three data bits $\{S_0, S_2, S_1\}$ are sequentially arranged and transmitted as the rate matching data bit sequence to be transmitted.

EXAMPLE 10

Step 1 and step 2 are the same as those in the example 9.

3. Three bits $\{S_1, S_2, S_0\}$ are read in the descending order of indexes from a position with a position index P0=M−1=2 in the circular buffer.

4. The three data bits $\{S_1, S_2, S_0\}$ are reversely arranged and transmitted as the rate matching data bit sequence to be transmitted.

EXAMPLE 11

Step 1 and step 2 are the same as those in the example 9.

3. Three bits $\{S_2, S_1, S_3\}$ are read in the ascending order of indexes from a position with a position index P0=N−M=1 in the circular buffer.

4. The three data bits $\{S_2, S_1, S_3\}$ are sequentially arranged and transmitted as the rate matching data bit sequence to be transmitted.

EXAMPLE 12

Step 1 and step 2 are the same as those in the example 9.

3. Three bits $\{S_3, S_1, S_2\}$ are read in the descending order of indexes from the ending position in the circular buffer.

4. The three data bits $\{S_3, S_1, S_2\}$ are reversely arranged and transmitted as the rate matching data bit sequence to be transmitted.

EXAMPLE 13

Step 1 is the same as that in the example 9.

2. The bit sequence in the circular buffer obtained in the example 9 is reversely arranged to obtain $\{S_3, S_1, S_2, S_0\}$.

Step 3 and step 4 are the same as those in the example 9.

EXAMPLE 14

Step 1 and step 2 are the same as those in the example 13.
Step 3 and step 4 are the same as those in the example 10.

EXAMPLE 15

Step 1 and step 2 are the same as those in the example 13.
Step 3 and step 4 are the same as those in the example 11.

EXAMPLE 16

Step 1 and step 2 are the same as those in the example 13.
Step 3 and step 4 are the same as those in the example 12.

The cases where the bit sequence in the circular buffer is divided into two parts are described below.

EXAMPLE 17

The rate matching method for the circular buffer of the Polar code includes the steps described below.

1. The Polar code is performed on an information bit sequence of length K=8 using code rate R=1/3, and the length of the encoded bit sequence is $N=2^{\lceil log_2(K/R) \rceil}=2^{\lceil log_2(8\times3) \rceil}=32$.

2. A part 1 of the circular buffer is composed of 6 continuous bits $\{S_0, S_1, \ldots, S_5\}$ in the encoded bit sequence; a part 2 of the circular buffer is composed of the continuous bits $\{S_6, S_7, \ldots, S_{31}\}$ in the encoded bit sequence in the BRO interleaving manner and thus a bit sequence in the part 2 is arranged as $\{S_{16}, S_8, S_{24}, S_{20}, S_{12}, S_{28}, S_{18}, S_{10}, S_{26}, S_6, S_{22}, S_{14}, S_{30}, S_{17}, S_9, S_{25}, S_{21}, S_{13}, S_{29}, S_{19}, S_{11}, S_{27}, S_7, S_{23}, S_{15}, S_{31}\}$.

3. 24 bits are read in the ascending order of indexes from a bit position with a position index $P_0=N-M=N-K/R=32-24=8$ in the circular buffer.

4. The 24 data bits are sequentially arranged and transmitted as the rate matching data bit sequence to be transmitted.

EXAMPLE 18

The rate matching method for the circular buffer of the Polar code includes the steps described below.

Step 1 and step 2 are the same as those in the example 17.

3. 24 bits are read in the descending order of indexes from the ending bit position in the circular buffer.

4. The 24 data bits are reversely arranged and transmitted as the rate matching data bit sequence to be transmitted.

EXAMPLE 19

The rate matching method for the circular buffer of the Polar code includes the steps described below.

1. The Polar code is performed on an information bit sequence of length K=8 using code rate R=1/3, and the length of the encoded bit sequence is $N=2^{\lceil log_2(K/R) \rceil}=2^{\lceil log_2(8\times3) \rceil}=32$.

2. The part 1 of the circular buffer is composed of 26 continuous bits $\{S_{31}, S_{30}, \ldots, S_7\}$ in the encoded bit sequence in the BRO interleaving manner; the part 2 of the circular buffer is composed of 6 continuous bits $\{S_5, S_4, \ldots, S_0\}$ in the encoded bit sequence in the sequential manner.

3. 24 bits are read in the ascending order of indexes from the starting position in the circular buffer.

4. The 24 data bits in a bit sequence read from the circular buffer are reversely arranged and transmitted as the rate matching data bit sequence to be transmitted.

EXAMPLE 20

The rate matching method for the circular buffer of the Polar code includes the steps described below.

Step 1 and step 2 are the same as those in the example 17.

3. 24 bits are read in the descending order of indexes from a bit position with a position index $P_0=M-1=K/R-1=24-1=23$ in the circular buffer.

4. The 24 data bits in the bit sequence read from the circular buffer are sequentially arranged and transmitted as the rate matching data bit sequence to be transmitted.

The cases where the bit sequence in the circular buffer is divided into three parts are described below.

EXAMPLE 21

The rate matching method for the circular buffer of the Polar code includes the steps described below.

1. The Polar code is performed on an information bit sequence of length K=64 using code rate R=1/3, and the length of the encoded bit sequence is $N=2^{\lceil log_2(K/R) \rceil}=2^{\lceil log_2(64\times3) \rceil}=256$.

2. A part 3 of the circular buffer is composed of 64 continuous bits $\{S_0, S_1, \ldots, S_{63}\}$ in the encoded bit sequence in the sequential manner; a part 4 of the circular buffer is composed of 64 bits $\{S_{64}, S_{65}, \ldots, S_{127}\}$ and 64 bits $\{S_{128}, S_{129}, \ldots, S_{191}\}$ in the encoded bit sequence in the interlace manner, which means that the part 4 is composed of bits $\{S_{64}, S_{128}, S_{65}, S_{129}, \ldots, S_{127}, S_{191}\}$; a part 5 of the circular buffer is composed of 64 continuous bits $\{S_{192}, S_{193}, \ldots, S_{255}\}$ in the encoded bit sequence in the sequential manner. Therefore, the bit sequence in the circular buffer is $\{S_0, S_1, \ldots, S_{63}, S_{64}, S_{128}, S_{65}, S_{129}, \ldots, S_{127}, S_{191}, S_{192}, S_{193}, \ldots, S_{255}\}$.

3. 192 bits are read in the ascending order of indexes from a bit position with a position index $P_0=N-M=N-K/R=256-192=64$ in the circular buffer.

4. The 192 data bits are sequentially arranged and transmitted as the rate matching data bit sequence to be transmitted.

EXAMPLE 22

The rate matching method for the circular buffer of the Polar code includes the steps described below.

Step 1 and step 2 are the same as those in the example 21.

3. 192 bits are read in the descending order of indexes from the ending bit position in the circular buffer.

4. The 192 data bits are reversely arranged and transmitted as the rate matching data bit sequence to be transmitted.

EXAMPLE 23

The rate matching method for the circular buffer of the Polar code includes the steps described below.

1. The Polar code is performed on the information bit sequence of length K=64 using code rate R=1/3, and the length of the encoded bit sequence is $N=2^{\lceil log_2(K/R) \rceil}=2^{\lceil log_2(64\times3) \rceil}=256$.

2. The part 3 of the circular buffer is composed of 64 continuous bits $\{S_{255}, S_{254}, \ldots, S_{192}\}$ in the encoded bit sequence in the sequential manner; the part 4 of the circular buffer is composed of 64 bits $\{S_{191}, S_{190}, \ldots, S_{128}\}$ and 64 bits $\{S_{127}, S_{126}, \ldots, S_{64}\}$ in the encoded bit sequence in the interlace manner, which means that the part 4 is composed of bits $\{S_{191}, S_{127}, S_{190}, S_{126}, \ldots, S_{128}, S_{64}\}$; the part 5 of the circular buffer is composed of 64 continuous bits $\{S_{63}, S_{62}, \ldots, S_{0}\}$ in the encoded bit sequence in the sequential manner. Therefore, the bit sequence in the circular buffer is $\{S_{255}, S_{254}, \ldots, S_{192}, S_{191}, S_{127}, S_{190}, S_{126}, \ldots, S_{128}, S_{64}, S_{63}, S_{62}, \ldots, S_{0}\}$.

3. 192 bits are read in the ascending order of indexes from the starting position in the circular buffer.

4. The 192 data bits in a bit sequence read from the circular buffer are reversely arranged and transmitted as the rate matching data bit sequence to be transmitted.

EXAMPLE 24

The rate matching method for the circular buffer of the Polar code includes the steps described below.

Step 1 and step 2 are the same as those in the example 23.

3. 192 bits are read in the descending order of indexes from a bit position with a position index $P_0=M-1=K/R-1=192-1=191$ in the circular buffer.

4. The 192 data bits in the bit sequence read from the circular buffer are sequentially arranged and transmitted as the rate matching data bit sequence to be transmitted.

The cases where the bit sequence in the circular buffer is divided into four parts are described below.

EXAMPLE 25

1. The Polar code is performed on an information bit sequence of length K=9 using code rate R=1/2, and the length of the encoded bit sequence is $N= 2^{\lceil log_2(K/R) \rceil} 2^{\lceil log_2(9\times 2) \rceil}=32$.

2. A bit sequence set is defined as $\{S_{BRO(j)}\}=\{S_9, S_{25}, S_5, S_{21}, S_{13}, S_{29}, S_3, S_{19}, S_{11}, S_{27}, S_7, S_{23}, S_{15}, S_{31}\}$. A part 6 $\{I_1\}$ of the circular buffer includes an intersection of $\{S_0, S_1, \ldots, S_5\}$ and $\{S_{BRO(j)}\}$ and is arranged in the BRO interleaving manner as $\{I_1\}=\{S_5, S_3\}$, where j=18, . . . , 31. A part 7 $\{I_2\}$ of the circular buffer is a difference set of $\{S_0, S_1, \ldots, S_5\}$ and $\{I_1\}$ and is arranged in the sequential manner as $\{I_2\}=\{S_0, S_1, S_2, S_4\}$. A part 9 $\{I_4\}$ of the circular buffer includes an intersection of $\{S_6, S_7, \ldots, S_{31}\}$ and $\{S_{BRO(j)}\}$ and is arranged in the BRO interleaving manner as $\{I_4\}=\{S_9, S_{25}, S_{21}, S_{13}, S_{29}, S_{19}, S_{11}, S_{27}, S_7, S_{23}, S_{15}, S_{31}\}$. A part 8 $\{S_{i_3}\}$ of the circular buffer is a difference set of $\{S_6, S_7, \ldots, S_{31}\}$ and $\{S_{i_4}\}$ and is arranged in the BRO interleaving manner as $\{I_3\}=\{S_{16}, S_8, S_{24}, S_{20}, S_{12}, S_{28}, S_{18}, S_{10}, S_{26}, S_6, S_{22}, S_{14}, S_{30}, S_{17}\}$. Therefore, the bit sequence in the circular buffer is $\{S_5, S_3, S_0, S_1, S_2, S_4, S_{16}, S_8, S_{24}, S_{20}, S_{12}, S_{28}, S_{18}, S_{10}, S_{26}, S_6, S_{22}, S_{14}, S_{30}, S_{17}, S_9, S_{25}, S_{21}, S_{13}, S_{29}, S_{19}, S_{11}, S_{27}, S_7, S_{23}, S_{15}, S_{31}\}$.

3. If R=1/2 is greater than the predefined threshold, 18 bits are read in the ascending order of indexes from a starting position of the part 7 in the circular buffer; if R=1/2 is less than the predefined threshold, 18 bits are read in the ascending order of indexes from a position with a position index $P_0=N-M=14$ in the circular buffer.

4. The 18 data bits in the bit sequence read from the circular buffer are sequentially arranged and transmitted as the rate matching data bit sequence to be transmitted.

EXAMPLE 26

Step 1 and step 2 are the same as those in the example 25.

3. If R=1/2 is greater than the predefined threshold, 18 bits are read in the descending order of indexes from an ending position of the part 8 in the circular buffer; if R=1/2 is less than the predefined threshold, 18 bits are read in the descending order of indexes from the ending position in the circular buffer.

4. The 18 data bits in a bit sequence read from the circular buffer are reversely arranged and transmitted as the rate matching data bit sequence to be transmitted.

EXAMPLE 27

The step 1 is the same as that in the example 25.

2. The bit sequence in the circular buffer obtained in the example 25 is reversely arranged to obtain $\{S_{31}, S_{15}, S_{23}, S_7, S_{27}, S_{11}, S_{19}, S_{29}, S_{13}, S_{21}, S_{25}, S_9, S_{17}, S_{30}, S_{14}, S_{22}, S_6, S_{26}, S_{10}, S_{18}, S_{28}, S_{12}, S_{20}, S_{24}, S_8, S_{16}, S_4, S_2, S_1, S_0, S_3, S_5\}$.

3. If R=1/2 is greater than the predefined threshold, 18 bits are read in the ascending order of indexes from the starting position of the part 7 in the circular buffer; if R=1/2 is less than the predefined threshold, 18 bits are read in the ascending order of indexes from the starting position in the circular buffer.

4. The 18 data bits in the bit sequence read from the circular buffer are sequentially arranged and transmitted as the rate matching data bit sequence to be transmitted.

EXAMPLE 28

Step 1 and step 2 are the same as those in the example 27.

3. If R=1/2 is greater than the predefined threshold, 18 bits are read in the descending order of indexes from the ending position of the part 8 in the circular buffer; if R=1/2 is less than the predefined threshold, 18 bits are read in the descending order of indexes from a position with a position index $P_0=M-1=17$ in the circular buffer.

4. The 18 data bits in a bit sequence read from the circular buffer are reversely arranged and transmitted as the rate matching data bit sequence to be transmitted.

EXAMPLE 29

Step 1 is the same as that in the example 25.

2. The part 6 of the circular buffer is $\{I_1\}=\{S_0, S_1, S_2, S_4\}$ the part 7 is $\{I_2\}=\{S_5, S_3\}$, the part 8 is $\{I_3\}=\{S_9, S_{25}, S_{21}, S_{13}, S_{29}, S_{19}, S_{11}, S_{27}, S_7, S_{23}, S_{15}, S_{31}\}$ and the part 9 is $\{I_4\}=\{S_{16}, S_8, S_{24}, S_{20}, S_{12}, S_{28}, S_{18}, S_{10}, S_{26}, S_6, S_{22}, S_{14}, S_{30}, S_{17}\}$. Therefore, the bit sequence in the circular buffer is $\{S_0, S_1, S_2, S_4, S_5, S_3, S_9, S_{25}, S_{21}, S_{13}, S_{29}, S_{19}, S_{11}, S_{27}, S_7, S_{23}, S_{15}, S_{31}, S_{16}, S_8, S_{24}, S_{20}, S_{12}, S_{28}, S_{18}, S_{10}, S_{26}, S_6, S_{22}, S_{14}, S_{30}, S_{17}\}$.

3. If R=1/2 is greater than the predefined threshold, 18 bits are read in the ascending order of indexes from a starting position of the part 9 in the circular buffer. If the reading goes to the ending position in the circular buffer, the reading is continued from the starting position in the circular buffer until the reading of 18 bits is completed. If R=1/2 is less than the predefined threshold, 18 bits are read in the ascending order of indexes from the starting position of the part 8 in the circular buffer. If the reading goes to the ending position in the circular buffer, the reading is continued from the starting position in the circular buffer until the reading of 18 bits is completed.

4. The 18 data bits in the bit sequence read from the circular buffer are sequentially arranged and transmitted as the rate matching data bit sequence to be transmitted.

EXAMPLE 30

Step 1 and step 2 are the same as those in the example 29.

3. If R=1/2 is greater than the predefined threshold, 18 bits are read in the descending order of indexes from an ending position of the part 6 in the circular buffer. If the reading goes to the starting position in the circular buffer, the reading is continued from the ending position in the circular buffer until the reading of 18 bits is completed. If R=1/2 is less than the predefined threshold, 18 bits are read in the descending order of indexes from a position with a position index $P_0=23$ in the circular buffer.

4. The 18 data bits in a bit sequence read from the circular buffer are reversely arranged and transmitted as the rate matching data bit sequence to be transmitted.

EXAMPLE 31

Step 1 is the same as that in the example 29.

2. The bit sequence in the circular buffer is obtained by reversely arranging the bit sequence in the example 29.

3. If R=1/2 is greater than the predefined threshold, 18 bits are read in the ascending order of indexes from the starting position of the part 9 in the circular buffer. If the reading goes to the ending position in the circular buffer, the reading is continued from the starting position in the circular buffer until the reading of 18 bits is completed. If R=1/2 is less than the predefined threshold, 18 bits are read in the ascending order of indexes from a position with a position index $P_0=8$ in the circular buffer.

4. The 18 data bits in the bit sequence read from the circular buffer are sequentially arranged and transmitted as the rate matching data bit sequence to be transmitted.

EXAMPLE 32

Step 1 and step 2 are the same as those in the example 31.

3. If R=1/2 is greater than the predefined threshold, 18 bits are read in the descending order of indexes from the ending position of the part 6 in the circular buffer. If the reading goes to the starting position in the circular buffer, the reading is continued from the ending position in the circular buffer until the reading of 18 bits is completed. If R=1/2 is less than the predefined threshold, 18 bits are read in the descending order of indexes from an ending position of the part 7 in the circular buffer.

4. The 18 data bits in a bit sequence read from the circular buffer are reversely arranged and transmitted as the rate matching data bit sequence to be transmitted.

EXAMPLE 33

1. The Polar code is performed on the information bit sequence of length K=2 using code rate R=2/3, and the length of the encoded bit sequence is $N=2^{\lceil log_2(K/R)\rceil+m}=2^{\lceil log_2(2\times 3/2)\rceil+1}=8$. At this time, m=1, but m is not limited to 1.

2. The BRO interleaving is performed on the initial bit sequence according to its mapping function to obtain the bit sequence $\{S_0, S_4, S_2, S_6, S_1, S_5, S_3, S_7\}$ in the circular buffer.

3. Three bits $\{S_0, S_4, S_2\}$ are read in the ascending order of indexes from the starting position in the circular buffer.

4. The three data bits $\{S_0, S_4, S_2\}$ are sequentially arranged and transmitted as the rate matching data bit sequence to be transmitted.

EXAMPLE 34

Step 1 and step 2 are the same as those in the example 33.

3. Three bits $\{S_2, S_4, S_0\}$ are read in the descending order of indexes from a position with a position index P0=M−1=2 in the circular buffer.

4. The three data bits $\{S_2, S_4, S_0\}$ are reversely arranged and transmitted as the rate matching data bit sequence to be transmitted.

EXAMPLE 35

Step 1 and step 2 are the same as those in the example 33.

3. Three bits $\{S_5, S_3, S_7\}$ are read in the ascending order of indexes from a position with a position index P0=N−M=5 in the circular buffer.

4. The three data bits $\{S_5, S_3, S_7\}$ are sequentially arranged and transmitted as the rate matching data bit sequence to be transmitted.

EXAMPLE 36

Step 1 and step 2 are the same as those in the example 33.

3. Three bits $\{S_7, S_3, S_5\}$ are read in the descending order of indexes from the ending position in the circular buffer.

4. The three data bits $\{S_7, S_3, S_5\}$ are reversely arranged and transmitted as the rate matching data bit sequence to be transmitted.

EXAMPLE 37

Step 1 is the same as that in the example 33.

2. The bit sequence in the circular buffer obtained in the example 33 is reversely arranged to obtain $\{S_7, S_3, S_5, S_1, S_6, S_2, S_4, S_0\}$.

Step 3 and step 4 are the same as those in the example 33.

EXAMPLE 38

Step 1 and step 2 are the same as those in the example 37.
Step 3 and step 4 are the same as those in the example 34.

EXAMPLE 39

Step 1 and step 2 are the same as those in the example 37.
Step 3 and step 4 are the same as those in the example 35.

EXAMPLE 40

Step 1 and step 2 are the same as those in the example 37.
Step 3 and step 4 are the same as those in the example 36.

EXAMPLE 41

1. The Polar code is performed on an information bit sequence of length K=24 using code rate R=1/4, and the length of the encoded bit sequence is N=128.

2. The mapping function for mapping the initial bit sequence is determined by p(n). The mapping function may be any one of the mapping functions in the examples 1 to 40, or may also be another one-to-one mapping function.

3. If the code rate R is less than the predefined threshold, M=96 bits are read in the ascending order of indexes from a position with a position index P0=N−M=32 in the circular buffer.

EXAMPLE 42

1. The Polar code is performed on the information bit sequence of length K=24 using code rate R=2/3, and the length of the encoded bit sequence is N=64.

2. The mapping function for mapping the initial bit sequence is determined by p(n). The mapping function may be any one of the mapping functions in the examples 1 to 40, or may also be another one-to-one mapping function.

3. If the code rate R is greater than the predefined threshold, M=36 bits are read in the ascending order of indexes from the starting position in the circular buffer.

Embodiment 4

This embodiment provides a storage medium. For example, in this embodiment, the storage medium may be configured to store program codes for executing the method for processing the bit sequence according to the embodiment described above.

For another example, in this embodiment, the storage medium may be located in any one of a group of computer terminals in a computer network, or located in any one of a group of mobile terminals.

For another example, in this embodiment, the storage medium is configured to store program codes for executing the steps described below.

In S1, K bit channels used as information bits and (N−K) frozen bits are concatenated to generate a bit sequence of N bits, and the bit sequence of N bits is encoded by means of a Polar code encoder with a generator matrix of size N×N to generate an initial bit sequence $\{S_0, S_1, \ldots, S_{N-1}\}$ of N bits, where K and N are both positive integers and K is less than or equal to N.

In S2, a circular buffer is divided into q parts, bits are selected from the initial bit sequence $\{S_0, S_1, \ldots, S_{N-1}\}$ in a non-repeated manner, and the bits are written into each part of the circular buffer according to a predefined rule, where q=1, 2, 3 or 4.

In S3, a bit sequence of a specified length is sequentially selected from a predefined starting position in a bit sequence in the circular buffer and the bit sequence of the specified length is taken as a bit sequence to be transmitted.

The serial numbers of the above embodiments are merely for ease of description and do not indicate superiority and inferiority of the embodiments.

In the above embodiments, for a part not described in detail in one or more embodiments, reference may be made to the related description in other embodiments.

The technical content disclosed in the embodiments of the present application may be implemented in other ways. The device embodiments described above are merely illustrative. For example, a unit classification is merely a logical function classification, and, in practice, the unit classification may be implemented in other ways. For example, multiple units or components may be combined or may be integrated into another system, or some features may be omitted or not executed. Additionally, the presented or discussed mutual coupling, direct coupling or communication connections may be indirect coupling or communication connections via interfaces, units or modules, or may be electrical or in other forms.

The units described above as separate components may or may not be physically separated. Components presented as units may or may not be physical units, i.e., may be located in one place or may be distributed on multiple network units. Part or all of these units may be selected according to actual requirements to achieve objects of the solutions in the embodiments of the present disclosure.

Additionally, multiple functional units in each embodiment may be integrated into one processing unit, or each unit may be physically present, or two or more units may be integrated into one unit. The integrated unit may be implemented by hardware or a software functional unit.

The integrated unit may be stored in a computer-readable storage medium if implemented in the form of a software functional unit and sold or used as an independent product. The content provided by the present disclosure substantially or the part contributing to the existing art or all or part of the technical solutions may be embodied in the form of a software product. The software product is stored in a storage medium and includes several instructions for enabling a computer device (which may be a personal computer, a server, a network device or the like) to execute all or part of the steps in the method according to the embodiments described above. The foregoing storage medium includes: a U disk, a read-only memory (ROM), a random access memory (RAM), a mobile hard disk, a magnetic disk, an optical disk or another medium capable of storing program codes.

INDUSTRIAL APPLICABILITY

The rate matching method and device for the Polar code provided by the present disclosure can solve the problems that Polar code hardware has high complexity and has a complicated encoding process in a hybrid automatic repeat request mechanism, significantly reducing the complexity of Polar code hardware and simplifying the encoding process.

What is claimed is:

1. A rate matching method for a Polar code, comprising:
concatenating K information bits and (N−K) frozen bits to generate a bit sequence of N bits, and encoding the bit sequence of N bits by means of a Polar code encoder with a generator matrix of size N×N to generate an initial bit sequence $\{S_0, S_1, \ldots, S_{N-1}\}$ of N bits, wherein K and N are both positive integers and K is less than or equal to N;
selecting bits from the initial bit sequence $\{S_0, S_1, \ldots, S_{N-1}\}$ and writing the bits into a circular buffer; and
sequentially selecting a bit sequence of a specified length from a predefined starting position in a bit sequence in the circular buffer; and
transmitting a bit sequence based on the bit sequence of the specified length,
wherein the predefined starting position is selected in the following manner:
when the code rate of the Polar encoding is less than or equal to a predefined threshold, the predefined starting position is determined as $P_0 = N - M$ in the circular buffer, wherein $P_o$ represents the position index of the bit sequence in the circular buffer, M is the length of the bit sequence to be transmitted, and N is the length of the initial bit sequence.

2. The method of claim 1, wherein the writing the bits into the circular buffer comprises:
writing the bits into the circular buffer based on a predefined rule, wherein the predefined rule is determined by a one-to-one mapping interleaving function p(n), wherein n=0, 1, ..., N−1, p(n)=0, 1, ..., N−1, p(n) is a bit position index in the initial bit sequence, and n is a position index in the circular buffer.

3. The method of claim 1, wherein the sequentially selecting the bit sequence of the specified length from the predefined starting position in the bit sequence in the circular buffer comprises:
sequentially selecting bits in an ascending order of indexes from a predefined position in the bit sequence in the circular buffer, reading from the predefined position to a first end of the bit sequence in the circular buffer, and continuing the reading from a second end of the bit sequence in the circular buffer until the bit sequence of the specified length is read.

4. An apparatus for rate matching for a Polar code, comprising:

a processor; and a non-transitory memory with instructions thereon, wherein the instructions upon execution by the processor cause the processor to:

concatenate K information bits and (N−K) frozen bits to generate a bit sequence of N bits, and encode the bit sequence of N bits by means of a Polar code encoder with a generator matrix of size N×N to generate an initial bit sequence $\{S_0, S_1, \ldots, S_{N-1}\}$ of N bits, wherein K and N are both positive integers and K is less than or equal to N;

select bits from the initial bit sequence $\{S_0, S_1, \ldots, S_{N-1}\}$ and write the bits into a circular buffer;

sequentially select a bit sequence of a specified length from a predefined starting position in the bit sequence in the circular buffer; and transmit a bit sequence based on the bit sequence of the specified length, wherein the predefined starting position is selected in the following manner:

when the code rate of the Polar encoding is less than or equal to a predefined threshold, the predefined starting position is determined as $P_0=N-M$ in the circular buffer, wherein $P_0$ represents the position index of the bit sequence in the circular buffer, M is the length of the bit sequence to be transmitted, and N is the length of the initial bit sequence.

5. The apparatus of claim 4, wherein writing the bits into the circular buffer comprises:

writing the bits into the circular buffer based on a predefined rule, wherein the predefined rule is determined by a one-to-one mapping interleaving function p(n), wherein n=0, 1, . . . , N−1, p(n)=0, 1, . . . , N−1, p(n) is a bit position index in the initial bit sequence, and n is a position index in the circular buffer.

6. The apparatus of claim 4, wherein the instructions upon execution by the processor further cause the processor, as part of sequentially selecting the bit sequence of the specified length from the predefined starting position in the bit sequence in the circular buffer, to:

sequentially select bits in an ascending order of indexes from the predefined position in the bit sequence in the circular buffer, read from the predefined position to a first end of the bit sequence in the circular buffer, and continue to read from a second end of the bit sequence in the circular buffer until the bit sequence of the specified length is read.

7. A non-transitory tangible computer-readable storage medium embodying program code executable by a computing system, the program code comprising:

instructions for concatenating K information bits and (N−K) frozen bits to generate a bit sequence of N bits, and encoding the bit sequence of N bits by means of a Polar code encoder with a generator matrix of size N×N to generate an initial bit sequence $\{S_0, S_1, \ldots, S_{N-1}\}$ of N bits, wherein K and N are both positive integers and K is less than or equal to N;

instructions for selecting bits from the initial bit sequence $\{S_0, S_1, \ldots, S_{N-1}\}$ and writing the bits into a circular buffer;

instructions for sequentially selecting a bit sequence of a specified length from a predefined starting position in a bit sequence in the circular buffer; and instructions for transmitting a bit sequence based on the bit sequence of the specified length, wherein the predefined starting position is selected in the following manner:

when the code rate of the Polar encoding is less than or equal to a predefined threshold, the predefined starting position is determined as $P_0=N-M$ in the circular buffer, wherein $P_0$ represents the position index of the bit sequence in the circular buffer, M is the length of the bit sequence to be transmitted, and N is the length of the initial bit sequence.

8. The non-transitory tangible computer-readable storage medium of claim 7, wherein the instructions for writing the bits into the circular buffer comprises:

instructions for writing the bits into the circular buffer based on a predefined rule, wherein the predefined rule is determined by a one-to-one mapping interleaving function p(n), wherein n=0, 1, . . . , N−1, p(n)=0, 1, . . . , N−1, p(n) is a bit position index in the initial bit sequence, and n is a position index in the circular buffer.

9. The non-transitory tangible computer-readable storage medium of claim 7, wherein the instructions for sequentially selecting the bit sequence of the specified length from the predefined starting position in the bit sequence in the circular buffer comprises:

instructions for sequentially selecting bits in an ascending order of indexes from a predefined position in the bit sequence in the circular buffer;

instructions for reading from the predefined position to a first end of the bit sequence in the circular buffer; and instructions for continuing the reading from a second end of the bit sequence in the circular buffer until the bit sequence of the specified length is read.

* * * * *

UNITED STATES PATENT AND TRADEMARK OFFICE
CERTIFICATE OF CORRECTION

PATENT NO. : 11,342,945 B2
APPLICATION NO. : 16/505688
DATED : May 24, 2022
INVENTOR(S) : Mengzhu Chen, Jin Xu and Jun Xu Page 1 of 1

It is certified that error appears in the above-identified patent and that said Letters Patent is hereby corrected as shown below:

In the Claims

Column 38, Claim 1, Line 46, delete "the" (first occurrence) and insert --a--, therefor;
Column 39, Claim 4, Line 28, delete "the" (first occurrence) and insert --a--, therefor;
Column 40, Claim 7, Line 24, delete "the" (first occurrence) and insert --a--, therefor.

Signed and Sealed this
Twenty-fourth Day of January, 2023

Katherine Kelly Vidal
*Director of the United States Patent and Trademark Office*